(12) United States Patent
Mizuno

(10) Patent No.: US 6,674,307 B2
(45) Date of Patent: Jan. 6, 2004

(54) GENERAL-PURPOSE LOGIC MODULE AND CELL USING THE SAME

(75) Inventor: Masaharu Mizuno, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 111 days.

(21) Appl. No.: 09/978,721

(22) Filed: Oct. 18, 2001

(65) Prior Publication Data
US 2002/0047727 A1 Apr. 25, 2002

(30) Foreign Application Priority Data
Oct. 19, 2000 (JP) ........................................ 2000/319269
Nov. 16, 2000 (JP) ........................................ 2000/349627

(51) Int. Cl.$^7$ ........................................... H03K 19/094
(52) U.S. Cl. ........................... 326/113; 326/37; 326/38; 326/47; 326/101
(58) Field of Search ........................... 326/37, 38, 47, 326/44, 101, 113

(56) References Cited

U.S. PATENT DOCUMENTS

| | | | |
|---|---|---|---|
| 4,910,417 A | | 3/1990 | El Gamal et al. |
| 5,055,718 A | | 10/1991 | Galbraith et al. |
| 5,646,558 A | * | 7/1997 | Jamshidi .................... 326/106 |
| 5,684,412 A | | 11/1997 | Yoeli et al. |
| 5,955,912 A | | 9/1999 | Ko |
| 6,014,038 A | | 1/2000 | How et al. |
| 6,020,772 A | | 2/2000 | Hayashi et al. |
| 6,356,118 B1 | * | 3/2002 | Rikino et al. ................ 326/113 |

FOREIGN PATENT DOCUMENTS

| | | |
|---|---|---|
| JP | 10-223902 | 8/1998 |
| TW | 308696 | 6/1997 |

* cited by examiner

Primary Examiner—Anh Tran
(74) Attorney, Agent, or Firm—McGinn & Gibb, PLLC

(57) ABSTRACT

A general-purpose logic module is composed of: a first inverter 10 in which an input terminal is connected to a first node T1; a second node T2 connected to an output terminal of the first inverter; a second inverter 11 in which an input terminal is connected to a third node T3; a sixth node T6 connected to an output terminal of the second inverter; a third inverter 12 in which an input terminal is connected to a fourth node T4; a first transfer gate 20 in which an input terminal is connected to the output terminal of the first inverter, a first control input terminal is connected to the fourth node T4, and a second control input terminal is connected to an output terminal of the third inverter; a second transfer gate 21 in which an input terminal is connected to the output terminal of the second inverter, a first control input terminal is connected to the output terminal of the third inverter, and a second control input terminal is connected to the fourth node T4; and a fifth node T5 connected to an output terminal of the first transfer gate and an output terminal of the second transfer gate. Accordingly, it is possible to provide a general-purpose logic module in which a switch can be carried out at a high speed, and a cell using the same.

19 Claims, 16 Drawing Sheets

Fig. 4A PRIOR ART
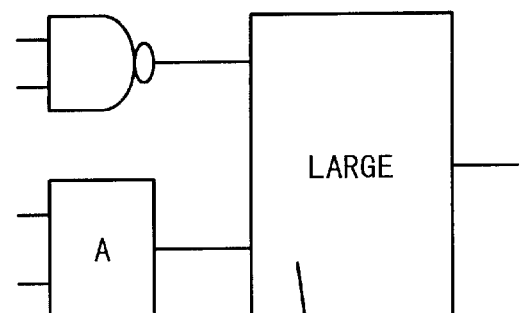
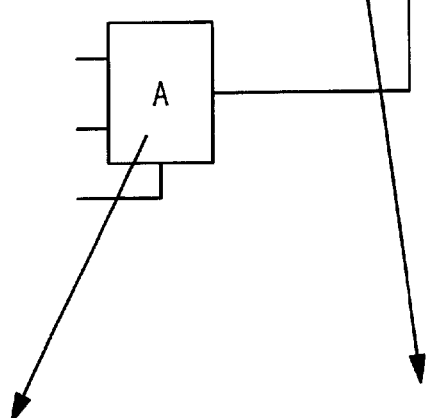
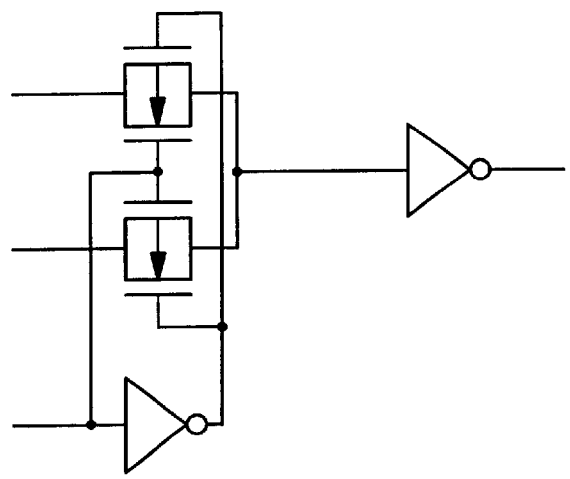
Fig. 4B PRIOR ART
Fig. 4C PRIOR ART

13 FOURTH INVERTER

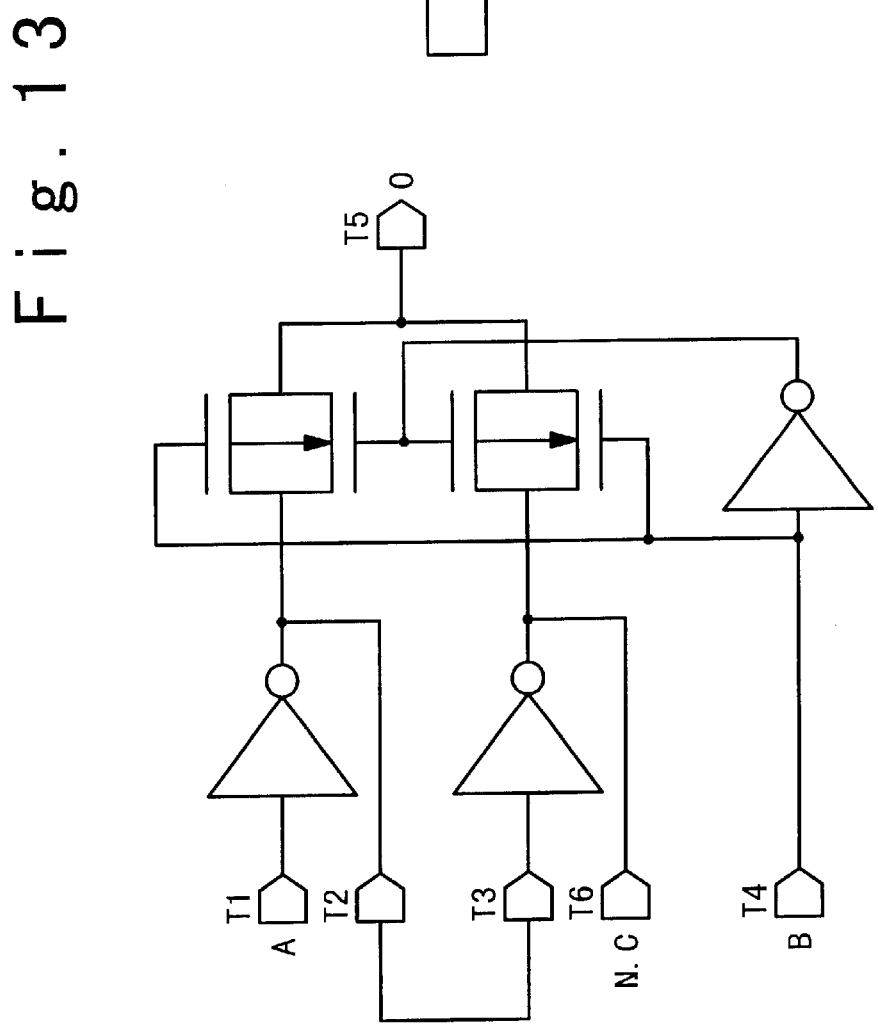
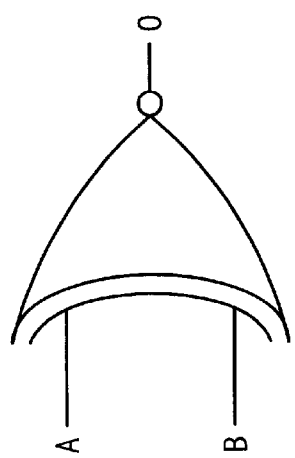
Fig. 13

GENERAL-PURPOSE LOGIC MODULE AND CELL USING THE SAME

BACKGROUND OF THE INVENTION

1. Field of the Invention

The present invention relates to a general-purpose logic module and a cell using the same. More particularly, the present invention relates to a basic circuit configuration of the general-purpose logic module and a structure of the cell.

2. Description of the Related Art

Conventionally, a general-purpose logic module used in a typical field programmable gate array (FPGA) and a mask programmable gate array with a function block base have been well known. This general-purpose logic module is formed such that a designer can select one of a plurality of logic functions.

As a general-purpose logic module provided with a multiplexer in which a plurality of combination logic functions can be selected, for example, Japanese Laid Open Patent Application (JP-A-Heisei, 7-106949) corresponding to U.S. Pat. No. 5,055,718 entitled "LOGIC MODULE WITH CONFIGURABLE COMBINATIONAL AND SEQUENTIAL BLOCKS" discloses "General Purpose Combination Logic Module". The general-purpose logic module disclosed in this gazette, as shown in FIG. 1, is provided with a four-input multiplexer (MUX). This four-input multiplexer is constituted by combining three two-input multiplexers.

This gazette does not clarify the configuration of the two-input multiplexer. Typically, a two-input multiplexer of a non-inversion output type is composed of inverters of a first stage, transfer gates of a second gate and an inverter of a third stage, as shown in FIG. 2. Thus, the inputted signal is passed through the logic elements of the three stages until the signal is outputted. If the four-input multiplexer shown in FIG. 1 is formed by using the two-input multiplexer having such configuration, the inputted signal is passed through the logic elements of six stages until the signal is outputted.

It should be noted that, when the two-input multiplexer is an inversion output type, the inverter of the third stage is removed. Thus, if the two-input multiplexer of this inversion output type is used to configure the four-input multiplexer shown in FIG. 1, the inputted signal is passed through the logic elements of four stages until the signal is outputted.

Moreover, the four-input multiplexer can be formed by using inverters and transfer gates as shown in FIG. 3, without any usage of the two-input multiplexer shown in FIG. 2. In the case of this four-input multiplexer shown in FIG. 3, the inputted signal is passed through the logic elements of four stages until the signal is outputted.

Also, as another general-purpose logic module, U.S. Pat. No. 5,684,412 discloses "CELL FORMING PART OF A COUSTOMIZABLE ARRAY". This general-purpose logic module is composed of a NAND gate, two two-input multiplexers A, A, and one two-input multiplexer LARGE, as shown in FIG. 4A. The two-input multiplexer A is composed of inverters of a first stage and transfer gates of a second stage, as shown in FIG. 4B. The two-input multiplexer LARGE is composed of transfer gates of a first gate and an inverter of a second stage, as shown in FIG. 4C. Thus, the signal inputted to the general-purpose logic module shown in FIG. 4A is outputted after passed through the logic elements composed of a maximum of four stages.

In addition to the above-mentioned general-purpose logic modules, a general-purpose logic module provided with a multiplexer in which a plurality of combination logic functions can be selected is disclosed in U.S. Pat. No. 4,910,417, U.S. Pat. No. 6,014,038 and the like.

Japanese Laid Open Patent Application (JP-A-Heisei, 10-223902) discloses "Semiconductor Integrated Circuit Apparatus". This semiconductor integrated circuit apparatus is provided with: a first region and a second region which are formed on an SOI substrate and arranged in parallel to and independently of each other; a first MOS transistor of a first channel type and a second MOS transistor of a second channel type in which they are formed on the first region, and their source diffusion layer regions and drain diffusion layers are connected to each other through a first diffusion layer wiring; and a third MOS transistor of the first channel type in which it is formed on the second region, and its source diffusion layer is connected to a source diffusion layer of the second MOS transistor, or its drain diffusion layer is connected to a drain diffusion layer of the second MOS transistor through a second diffusion layer wiring.

Because of the above-mentioned configuration, it is possible to solve such conventional problems that a PN element separation region for arranging the bulk CMOS transistor is required, the connection using a metallic wiring is required to connect between the drain diffusion layers of an N-channel MOS transistor and a P-channel MOS transistor, and a wiring area within a block is increased.

Each of the above-mentioned general-purpose logic modules is provided with the multiplexer composed of the plurality of inputs and the plurality of stages, in which the plurality of two-input multiplexers are connected in serial at the plurality of stages. The desirable logic circuit is established by setting its input terminal to a logic value "1" (for example, a power supply potential) or a logic value "0" (for example, a ground potential).

However, the above-mentioned conventional general-purpose logic modules are formed such that the two-input multiplexers are connected in serial at the plurality of stages. Thus, the number of the stages of the logic elements through which the signal is passed becomes large. Moreover, the transfer gates are inserted in serial at the plurality of stages. For this reason, the conventional general-purpose logic modules have the defect that a switching speed is slow, as compared with a configuration of a circuit, such as a gate array cell base IC or the like, which can be provided with a simple logic circuit.

Its difference is extreme if the comparison is done between the function of a two-input NAND, a two-input NOR, a two-input EXOR, a two-input EXNOR and the like which are constituted by using the general-purpose logic module shown in FIG. 1 or FIG. 4A and the function of those which are constituted by using the gate array cell base IC or the like. Especially, in a case of a configuration using a usual ASIC, the difference of an inner gate delay characteristic occurring in the two-input NAND, the two-input NOR and the like that can be constituted by one stage logic is evident.

These problems are brought about because of a large number of logic element stages since the circuit configuration using the multiplexers composed of the plurality of inputs and the plurality of stages are employed such as the serial connection of the plurality of two-input multiplexers and because of the configuration of the logic circuit in which the plurality of transfer gates are inserted in serial.

SUMMARY OF THE INVENTION

The present invention is accomplished to remove the above-mentioned problems. Therefore, an object of the present invention is to provide a general-purpose logic module in which a switch can be carried out at a high speed, and a cell using the same.

In order to achieve the above-mentioned object, a general-purpose logic module according to a first aspect of the present invention is composed of: a first inverter in which an input is connected to a first node; a second node connected to an output of the first inverter; a second inverter in which an input is connected to a third node; a third inverter in which an input is connected to a fourth node; a first transfer gate in which an input is connected to the output of the first inverter, a first control input is connected to the fourth node, and a second control input is connected to an output of the third inverter; a second transfer gate in which an input is connected to the output of the second inverter, a first control input is connected to the output of the third inverter, and a second control input is connected to the fourth node; and a fifth node connected to an output of the first transfer gate and an output of the second transfer gate.

In order to achieve the above-mentioned object, a cell according to a second aspect of the present invention is composed of a first general-purpose logic module according to the first aspect of the present invention, a second general-purpose logic module and a third general-purpose logic module. The second general-purpose logic module includes a fourth inverter in which an input is connected to a seventh node and an output is connected to an eighth node. The third general-purpose logic module includes: a fifth inverter in which an input is connected to an eleventh node; a third transfer gate in which an input is connected to a ninth node, a first control input is inputted to the eleventh node, and a second control input is connected to an output of the fifth inverter; a fourth transfer gate in which an input is connected to a tenth node, a first control input is connected to an output of the fifth inverter, and a second control input is connected to the eleventh node; a sixth inverter in which an input is connected to an output of the third transfer gate and an output of the fourth transfer gate; and a twelfth node which is connected to an output of the sixth inverter.

In order to achieve the above-mentioned object, a general-purpose logic module according to a third aspect of the present invention is composed of: a first inverter in which an input is connected to a first node; a second inverter in which an input is connected to a third node; a sixth node which is connected to an output of the second inverter; a third inverter in which an input is connected to a fourth node; a first transfer gate in which an input is connected to an output of the first inverter, a first control input is connected to the fourth node, and a second control input is connected to an output of the third inverter; a second transfer gate in which an input is connected to an output of the second inverter, a first control input is connected to an output of the third inverter, and a second control input is connected to the fourth node; and a fifth node which is connected to an output of the first transfer gate and an output of the second transfer gate.

In order to achieve the above-mentioned object, a cell according to a fourth aspect of the present invention is composed of a first general-purpose logic module according to the third aspect of the present invention, a second general-purpose logic module and a third general-purpose logic module. The second general-purpose logic module includes a fourth inverter in which an input is connected to a seventh node and an output is connected to an eighth node. The third general-purpose logic module includes: a fifth inverter in which an input is connected to an eleventh node; a third transfer gate in which an input is connected to a ninth node, a first control input is inputted to the eleventh node, and a second control input is connected to an output of the fifth inverter; a fourth transfer gate in which an input is connected to a tenth node, a first control input is connected to an output of the fifth inverter, and a second control input is connected to the eleventh node; a sixth inverter in which an input is connected to an output of the third transfer gate and an output of the fourth transfer gate; and a twelfth node which is connected to an output of the sixth inverter.

BRIEF DESCRIPTION OF THE DRAWINGS

FIGS. 4A to 4C are views describing another conventional general-purpose logic module;

FIG. 13 is a view showing an example in which an EXNOR circuit is constituted by using the cell shown in FIG. 10;

DESCRIPTION OF THE PREFERRED EMBODIMENT

Now, embodiments of the present invention will be described below with reference to the drawings.
(First Embodiment)

A first embodiment of the present invention is designed such that a general-purpose logic module has a multiplexer function by using a transfer gate and an inverter which are connected in series, and an output from the inverter can be used as a node.

Figure 1:
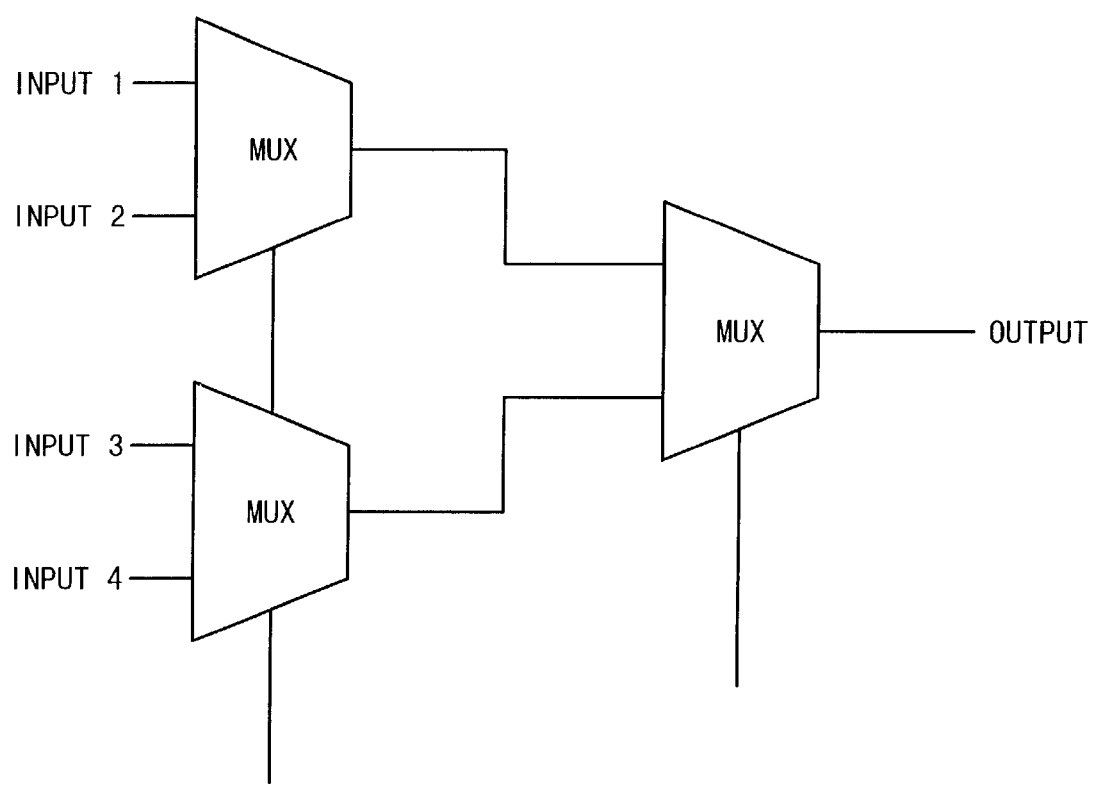
FIG. 1 is a view illustrating a conventional general-purpose logic module.
Figure 2:
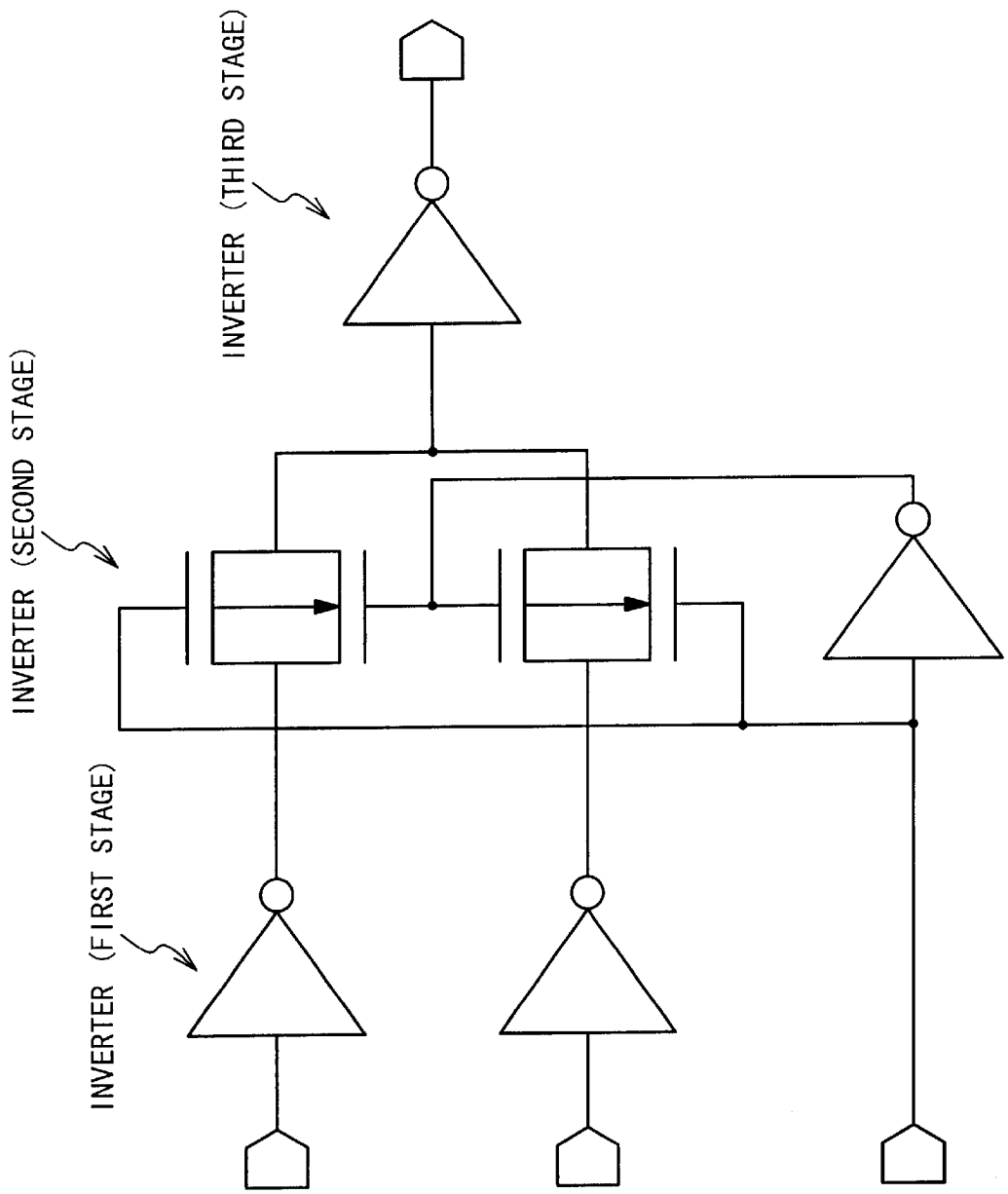
FIG. 2 is a circuit diagram showing a configuration of a multiplexer used in FIG. 1.
Figure 3:
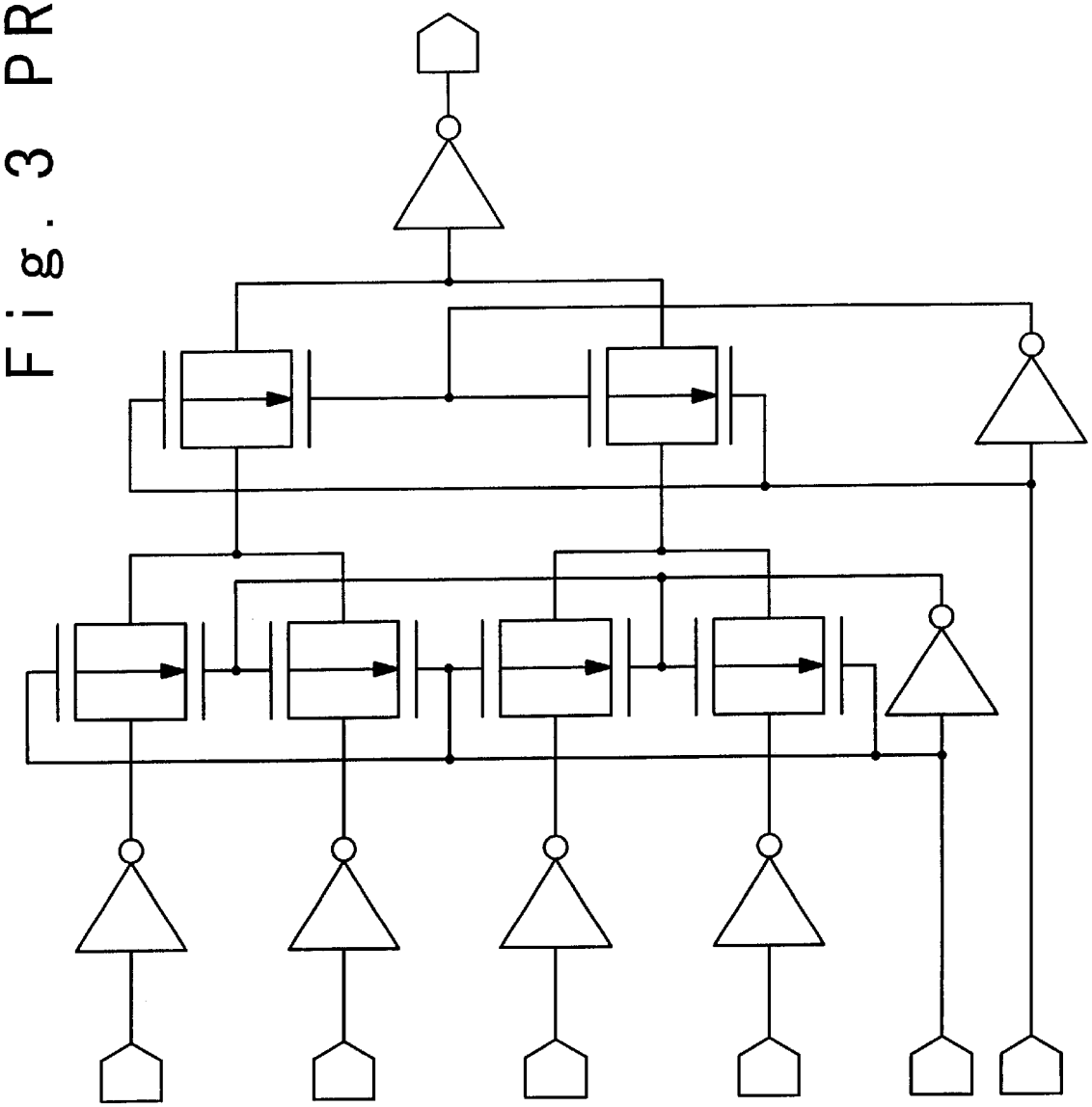
FIG. 3 is a circuit diagram showing another configuration of the general-purpose logic module shown in FIG. 1.
Figure 5:
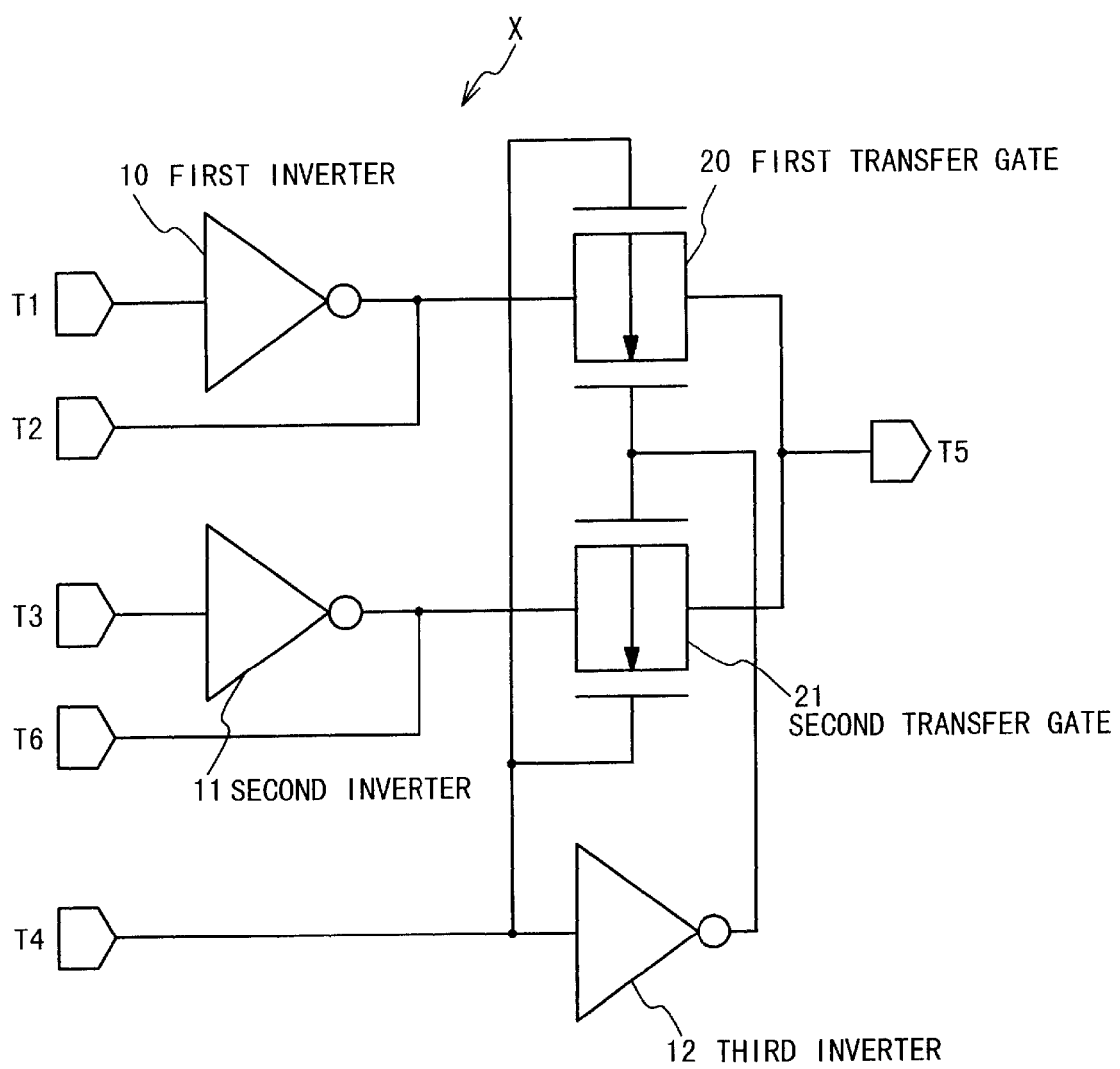
FIG. 5 is a circuit diagram showing a configuration of a general-purpose logic module according to a first embodiment of the present invention.

FIG. 5 is a circuit diagram showing the configuration of the general-purpose logic module according to the first embodiment of the present invention. This general-purpose logic module is composed of a two-input multiplexer of an inversion output type in which the first stage is the inverter and the second stage is the transfer gate. This general-purpose logic module is provided with: six nodes of a first node T1, a second node T2, a third node T3, a fourth node T4, a fifth node T5 and a sixth node T6; and five logic elements of a first inverter 10, a second inverter 11, a third inverter 12, a first transfer gate 20 and a second transfer gate 21.

Each of the first to third inverters 10 to 12 has a known structure, for example, in which an N-channel MOS transistor and a P-channel MOS transistor are connected in serial with each other between a power supply and a ground, and an inputted signal is inverted and outputted. Each of those first to third inverters 10 to 12 is formed at a small size in order to reduce an input capacitance.

Each of the first and second transfer gates 20, 21 has the structure in which the N-channel MOS transistor and the P-channel MOS transistor are connected in parallel to each other, namely, the structure in which their sources are connected to each other and their drains are connected to each other. Depending on the signals supplied to a gate of the N-channel MOS transistor and a gate of the P-channel MOS transistor, a signal supplied to an input terminal of the transfer gate is passed, or the pass of the signal is stopped. Hereafter, the gate of the P-channel MOS transistor is referred to as a first control input terminal, and the gate of the N-channel MOS transistor is referred to as a second control input terminal.

The first node T1 is connected to an input terminal of the first inverter 10. An output terminal of the first inverter 10 is connected to an input terminal of the first transfer gate 20 and the second node T2.

The third node T3 is connected to an input terminal of the second inverter 11. An output terminal of the second inverter 11 is connected to an input terminal of the second transfer gate 21 and the sixth node T6.

The fourth node T4 is connected to an input terminal of the third inverter 12, the first control input terminal of the first transfer gate 20 and the second control input terminal of the second transfer gate 21. An output terminal of the third inverter 12 is connected to the second control input terminal of the first transfer gate 20 and the first control input terminal of the second transfer gate 21.

An output terminal of the first transfer gate 20 and an output terminal of the second transfer gate 21 are connected to the fifth node T5.

The operation of the general-purpose logic module having the above-mentioned configuration will be described below. This general-purpose logic module basically functions as a multiplexer. That is, when a low level (hereafter, referred to as "L Level") signal is inputted to the fourth node T4, both of the P-channel MOS transistor and the N-channel MOS transistor constituting the first transfer gate 20 are turned on, and both the P-channel MOS transistor and the N-channel MOS transistor constituting the second transfer gate 21 are turned off. As a result, the signal inputted from the first node T1 is inverted by the first inverter 10, and outputted through the first transfer gate 20 from the fifth node T5.

On the other hand, when a high level (hereafter, referred to as "H Level") signal is inputted to the fourth node T4, both of the P-channel MOS transistor and the N-channel MOS transistor constituting the first transfer gate 20 are turned off, and both the P-channel MOS transistor and the N-channel MOS transistor constituting the second transfer gate 21 are turned on. As a result, the signal inputted from the third node T3 is inverted by the second inverter 11, and outputted through the second transfer gate 21 from the fifth node T5.

By the above-mentioned operation, the function of the multiplexer of the inversion output type is attained. That is, depending on the level of the signal supplied to the fourth node T4, any one of the signal inputted to the first node T1 and the signal inputted to the third node T3 is inverted, and then outputted from the fifth node T5.

Figure 6:
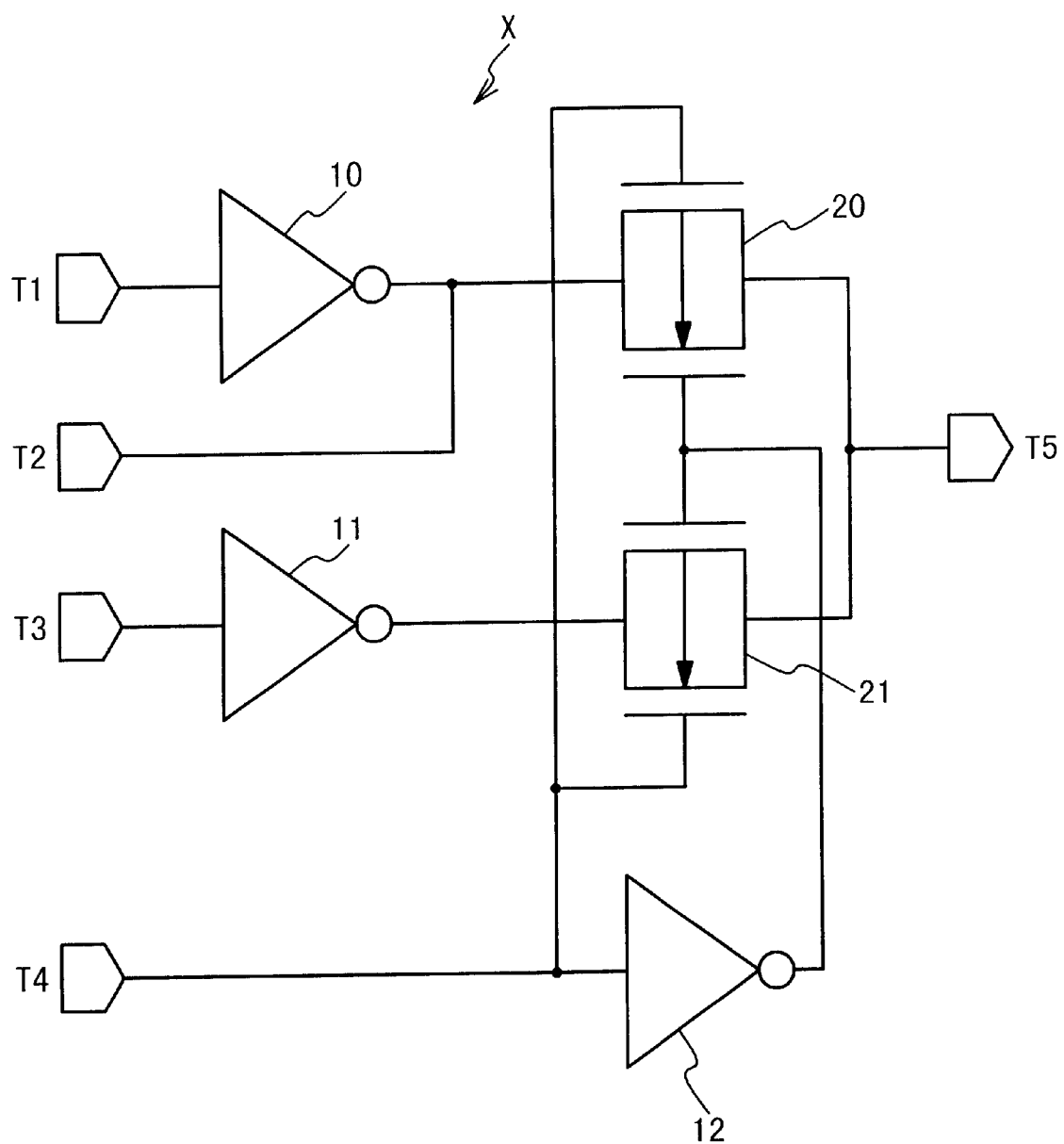
FIG. 6 is a circuit diagram showing a variation of the general-purpose logic module shown in FIG. 5.
Figure 7:
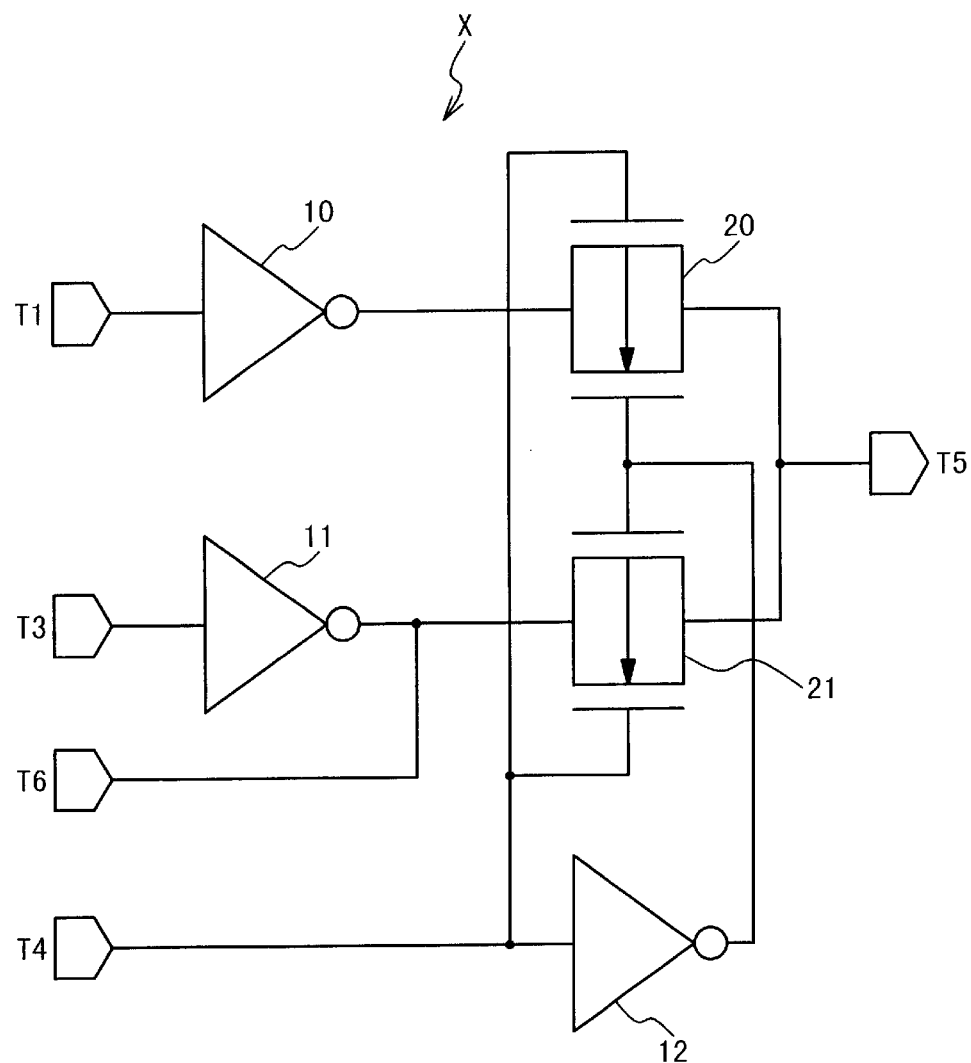
FIG. 7 is a circuit diagram showing another variation of the general-purpose logic module shown in FIG. 5.

As necessary, this general-purpose logic module can be formed by removing the sixth node T6 from the general-purpose logic module shown in FIG. 5, as shown in FIG. 6, or by removing the second node T2 from the general-purpose logic module shown in FIG. 5, as shown in FIG. 7.

(Second Embodiment)

A second embodiment of the present invention is a cell including the general-purpose logic module according to the first embodiment.

Figure 10:
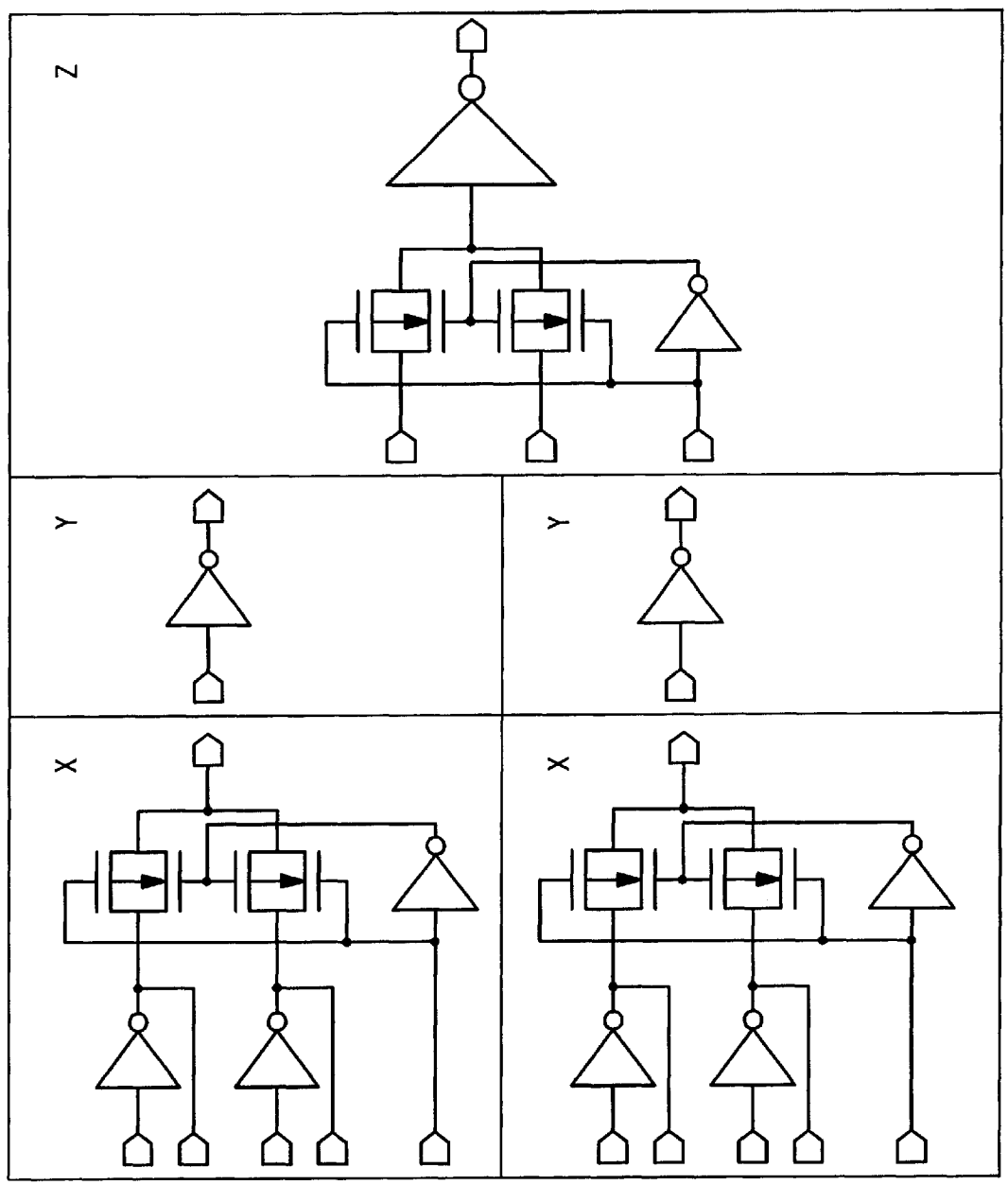
FIG. 10 is a circuit diagram showing a configuration of the cell according to the second embodiment of the present invention.

FIG. 10 is a view showing the configuration of this cell. This cell is composed of the first general-purpose logic module X, a second general-purpose logic module Y and a third general-purpose logic module Z. The first general-purpose logic module X is the general-purpose logic module according to the first embodiment. It should be noted that, as for the cell shown in FIG. 10, for the purpose of easy illustration, the case is illustrated in which the number of the first general-purpose logic modules X is two, the number of the second general-purpose logic modules Y is two and the number of the third general-purpose logic module Z is one. However, the respective numbers of the general-purpose logic modules are arbitrary.

It is desired that the cell includes the first general-purpose logic module X, the second general-purpose logic module Y and the general-purpose logic module Z at a ratio of 2:2:1. However, it is not limited to this ratio.

Figure 8:
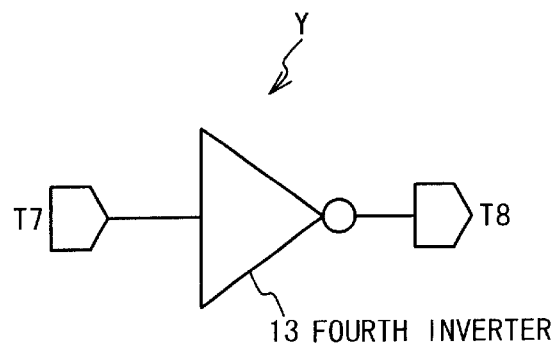
FIG. 8 is a circuit diagram showing a configuration of a second general-purpose logic module used in a cell according to a second embodiment of the present invention.

The second general-purpose logic module Y is constituted by a fourth inverter 13 in which a seventh node T7 is connected to an input terminal, and an eighth node T8 is connected to an output terminal, as shown in FIG. 8.

Figure 9:
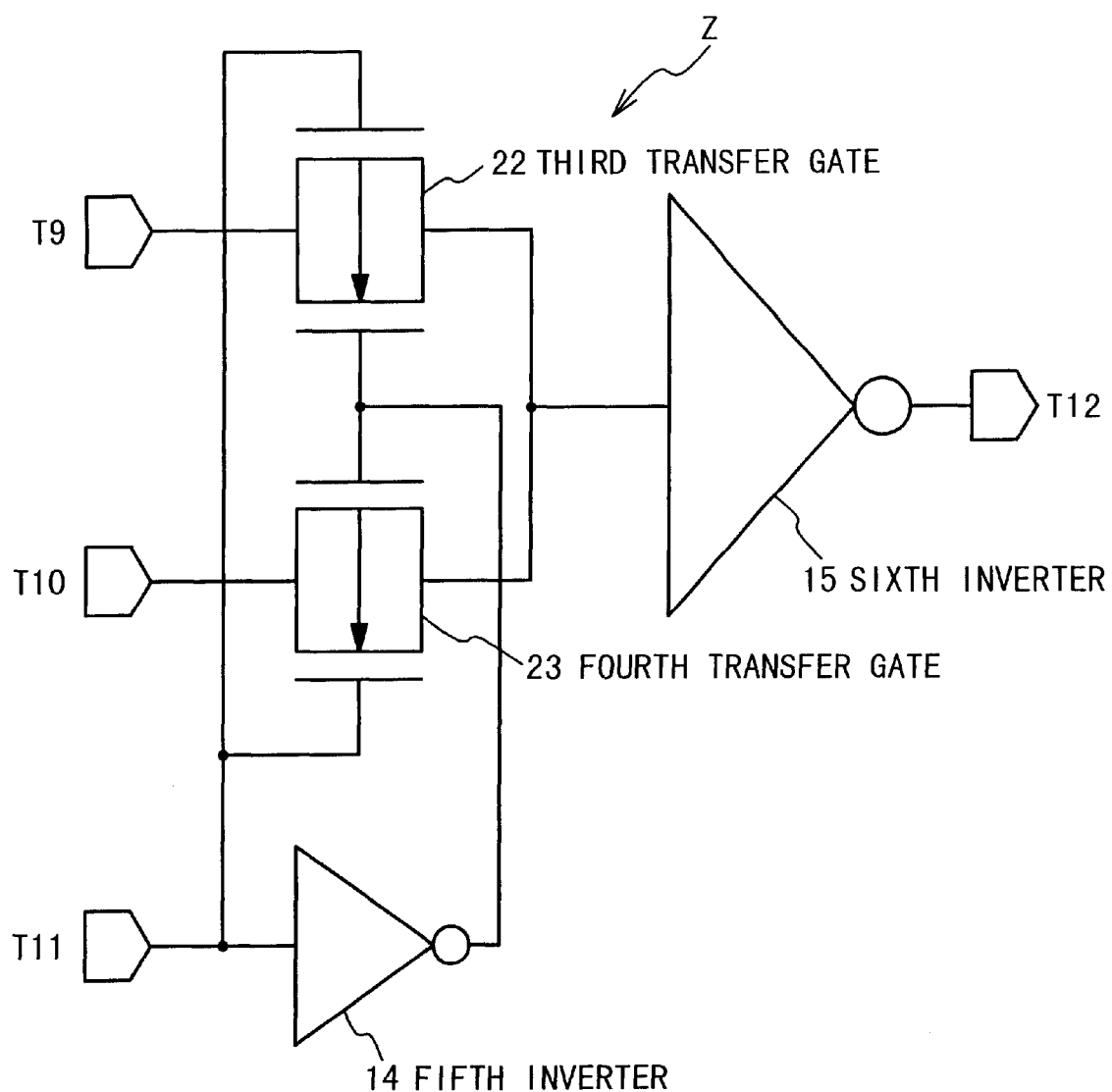
FIG. 9 is a circuit diagram showing a configuration of a third general-purpose logic module used in a cell according to a second embodiment of the present invention.

Also, the third general-purpose logic module Z is constituted by a two-input multiplexer of an inversion output type which is composed of transfer gates of a first stage and an inverter of a second stage, as shown in FIG. 9.

This third general-purpose logic module Z is composed of: four nodes of a ninth node T9, a tenth node T10, an eleventh node T11 and a twelfth node T12; and four logic elements of a fifth inverter 15, a sixth inverter 15, a third transfer gate 22 and a fourth transfer gate 23.

The fifth inverter 14 is equal to the first to third inverters 10 to 12 in the first embodiment. The sixth inverter 15 is formed at a larger size in order to improve an ability to drive, although having the same circuit structure and function as the first to third inverters 10 to 12. Also, the third transfer gate 22 and the fourth transfer gate 23 are equal to the first transfer gate 20 and the second transfer gate in the first embodiment, respectively.

The ninth node T9 is connected to an input terminal of the third transfer gate 22. An output terminal of the third transfer gate 22 is connected to an input terminal of the sixth inverter 15.

The tenth node T10 is connected to an input terminal of the fourth transfer gate 23. An output terminal of the fourth transfer gate 23 is connected to the input terminal of the sixth inverter 15.

The eleventh node T11 is connected to an input terminal of the fifth inverter 14, a first control input terminal of the third transfer gate 22 and a second control input terminal of the fourth transfer gate 23. An output terminal of the fifth inverter 14 is connected to a second control input terminal of the third transfer gate 22 and a first control input terminal of the fourth transfer gate 23. An output terminal of the sixth inverter 15 is connected to the twelfth node T12.

The operation of the third general-purpose logic module Z having the above-mentioned configuration will be described below. This third general-purpose logic module Z basically functions as a multiplexer. That is, when a signal of the L level is inputted to the eleventh node T11, both of a P-channel MOS transistor and an N-channel MOS transistor constituting the third transfer gate 22 are turned on, and both a P-channel MOS transistor and an N-channel MOS transistor constituting the fourth transfer gate 23 are turned off. As a result, the signal inputted from the ninth node T9 is passed through the third transfer gate 22, and inverted by the sixth inverter 15, and then outputted from the twelfth node T12.

On the other hand, when a signal of the H level is inputted to the eleventh node T11, both of the P-channel MOS transistor and the N-channel MOS transistor constituting the third transfer gate 22 are turned off, and both the P-channel MOS transistor and the N-channel MOS transistor constituting the fourth transfer gate 23 are turned on. As a result, the signal inputted from the tenth node T10 is passed through the fourth transfer gate 23, and inverted by the sixth inverter 15, and then outputted from the twelfth node T12.

By the above-mentioned operation, the function of the multiplexer of the inversion output type is attained. That is, depending on the level of the signal supplied to the eleventh node T11, any one of the signal inputted to the ninth node T9 and the signal inputted to the tenth node T12 is inverted, and then outputted from the twelfth node T12.

An example will be described below in which the cell having the above-mentioned configuration is used to configure several logic circuits.

Figure 11:
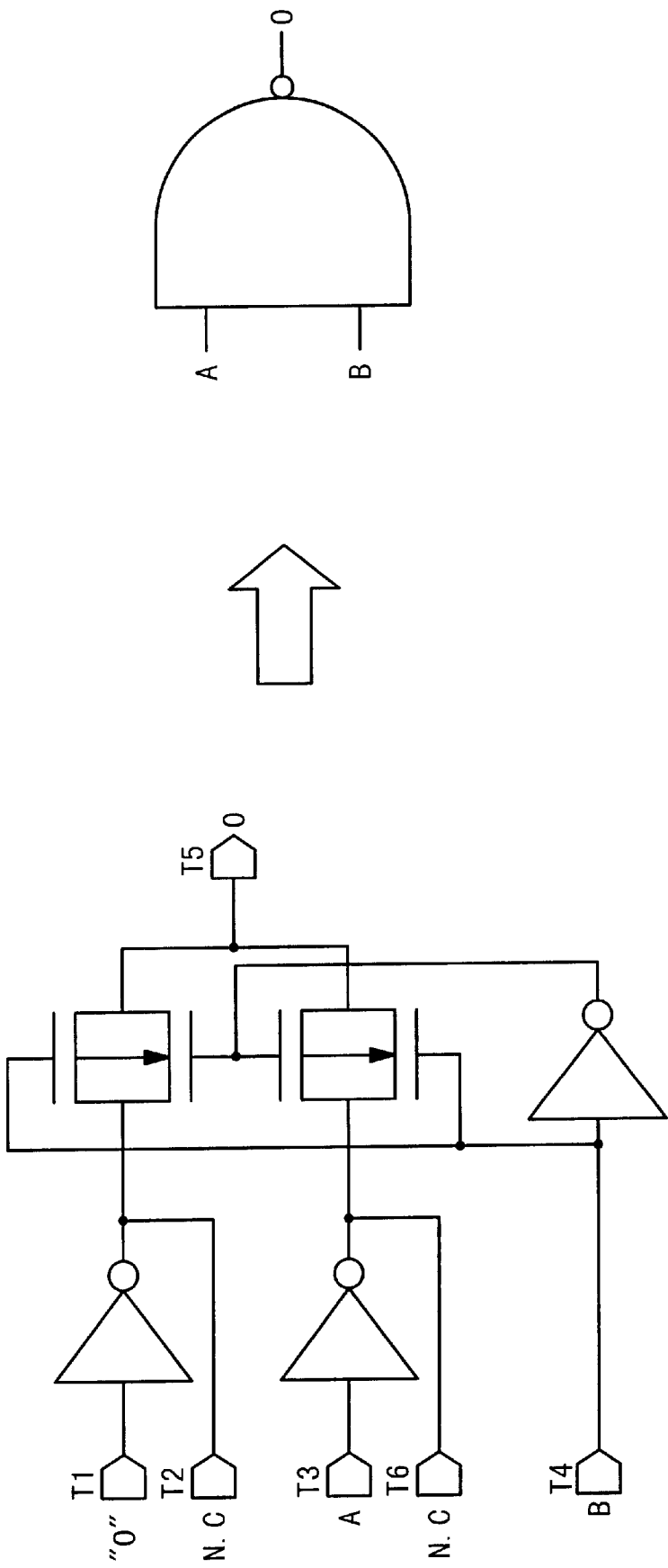
FIG. 11 is a view showing an example in which a NAND circuit is constituted by using the cell shown in FIG. 10.

FIG. 11 is an example in which the first general-purpose logic module X of the type shown in FIG. 5 is used to configure a NAND circuit.

This NAND circuit is formed such that the first node T1 of the first general-purpose logic module X of the type shown in FIG. 5 is connected to the H level (logic "0") and the second node T2 and the sixth node T6 are set at a non-connection (N.C). Thus, the two-input NAND circuit is attained in which the third node T3 (A) and the fourth node T4 (B) are used as the input terminals and the fifth node T5 is used as an output terminal (O).

In the general-purpose logic module explained in the column of the description of the related art, the inputted signal is passed through the logic elements of the four or six stages until the signal is outputted. On the contrary, according to this NAND circuit, the inputted signal is only passed through the logic elements of the two stages such as one inverter and one transfer gate. Thus, it is possible to shorten the time of the inner gate delay. It should be noted that the inner gate delay implies the delay time substantially determined by the number of the stages of the logic elements, except a wiring load capacitance occurring at an output end, a gate load capacitance and the like. It will be used below under the same meaning.

It should be noted that this NAND circuit can be formed by using the first general-purpose logic module of the type shown in FIG. 6. In this case, the first node T1 is connected to the H level (logic "0"), and the second node T2 is set at the non-connection. Thus, the two-input NAND circuit is attained in which the third node T3 (A) and the fourth node T4 (B) are used as the input terminals and the fifth node T5 is used as the output terminal (O).

Also, this NAND circuit can be formed by using the first general-purpose logic module of the type shown in FIG. 7. In this case, the first node T1 is connected to the H level (logic "0"), and the sixth node T6 is set at the non-connection. Thus, the two-input NAND circuit is attained in which the third node T3 (A) and the fourth node T4 (B) are used as the input terminals and the fifth node T5 is used as the output terminal (O).

Figure 12:
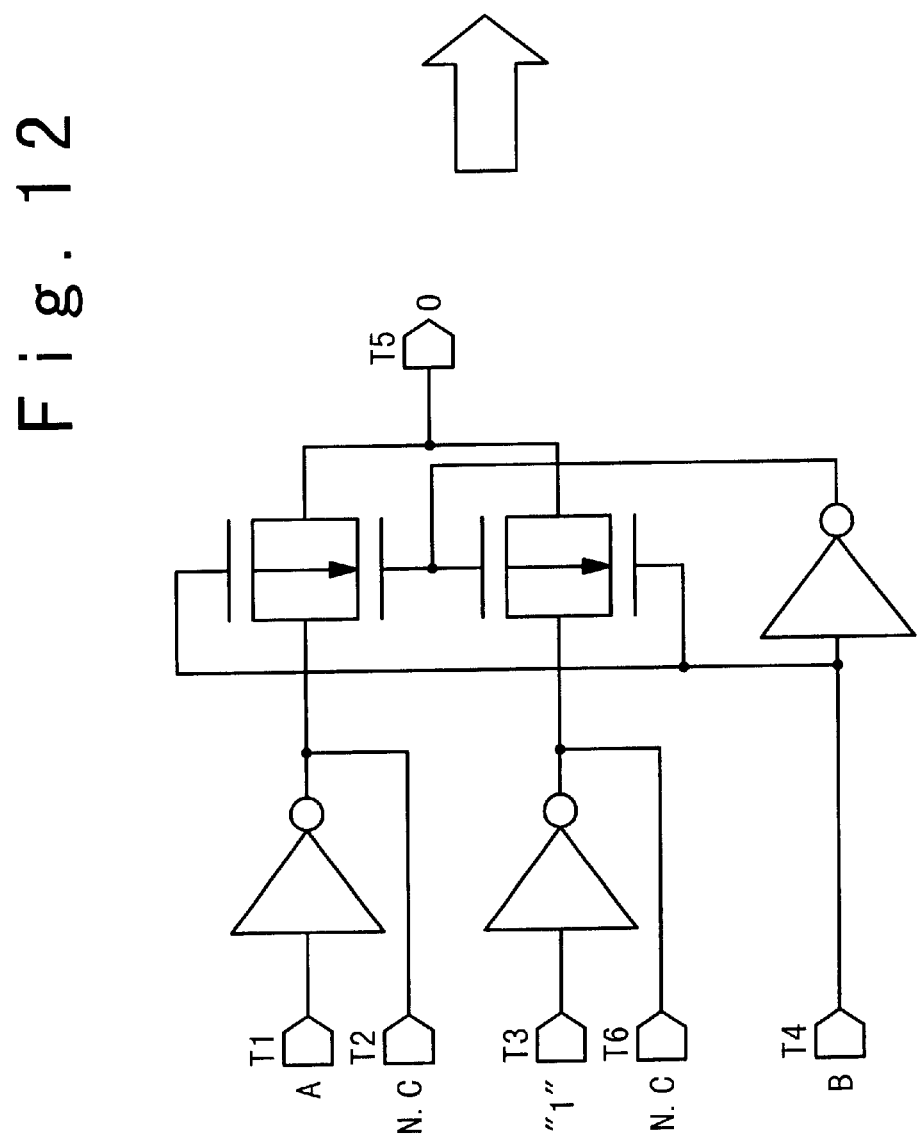
FIG. 12 is a view showing an example in which a NOR circuit is constituted by using the cell shown in FIG. 10.

FIG. 12 is an example in which the first general-purpose logic module of the type shown in FIG. 5 is used to configure an NOR circuit.

This NOR circuit is formed such that the third node T3 of the first general-purpose logic module X is connected to the L level (logic "1"), and the second node T2 and the sixth node T6 are set at the non-connection. Thus, the two-input NOR circuit is attained in which the first node T1 (A) and the fourth node T4 (B) are used as the input terminals, and the fifth node T5 is used as the output terminal (O).

According to this NOR circuit, similarly to the above-mentioned NAND circuit, the input signal is only passed through the logic elements of the two stages. Thus, it is possible to shorten the time of the inner gate delay.

It should be noted that this NOR circuit can be formed by using the first general-purpose logic module of the type shown in FIG. 6. In this case, the third node T3 is connected to the L level (logic "1"), and the second node T2 is set at the non-connection. Thus, the two-input NOR circuit is attained in which the first node T1 (A) and the fourth node T4 (B) are used as the input terminals, and the fifth node T5 is used as the output terminal (O).

Also, this NOR circuit can be formed by using the first general-purpose logic module of the type shown in FIG. 7. In this case, the third node T3 is connected to the L level (logic "1"), and the sixth node T6 is set at the non-connection. Thus, the two-input NOR circuit is attained in which the third node T3 (A) and the fourth node T4 (B) are used as the input terminals, and the fifth node T5 is used as the output terminal (O).

FIG. 13 is an example in which the first general-purpose logic module of the type shown in FIG. 5 is used to configure an EXNOR circuit.

This EXNOR circuit is formed such that the second node T2 and the third node T3 of the first general-purpose logic module X is connected to each other, and the sixth node T6 is set at the non-connection. Thus, the two-input EXNOR circuit is attained in which the first node T1 (A) and the fourth node T4 (B) are used as the input terminals, and the fifth node T5 is used as the output terminal (O).

According to this EXNOR circuit, although the inputted signal in the general-purpose logic module explained in the column of the description of the related art is passed through the logic elements of the four or six stages until the signal is outputted, the input signal is only passed through the logic elements of the three stages such as the inverters of two stages and the transfer gate of one stage. Thus, it is possible to shorten the time of the inner gate delay.

It should be noted that this EXNOR circuit can be formed by using the first general-purpose logic module of the type shown in FIG. 6. In this case, the second node T2 and the third node T3 are connected to each other. Thus, the two-input EXNOR circuit is attained in which the first node T1 (A) and the fourth node T4 (B) are used as the input terminals, and the fifth node T5 is used as the output terminal (O).

Figure 14:
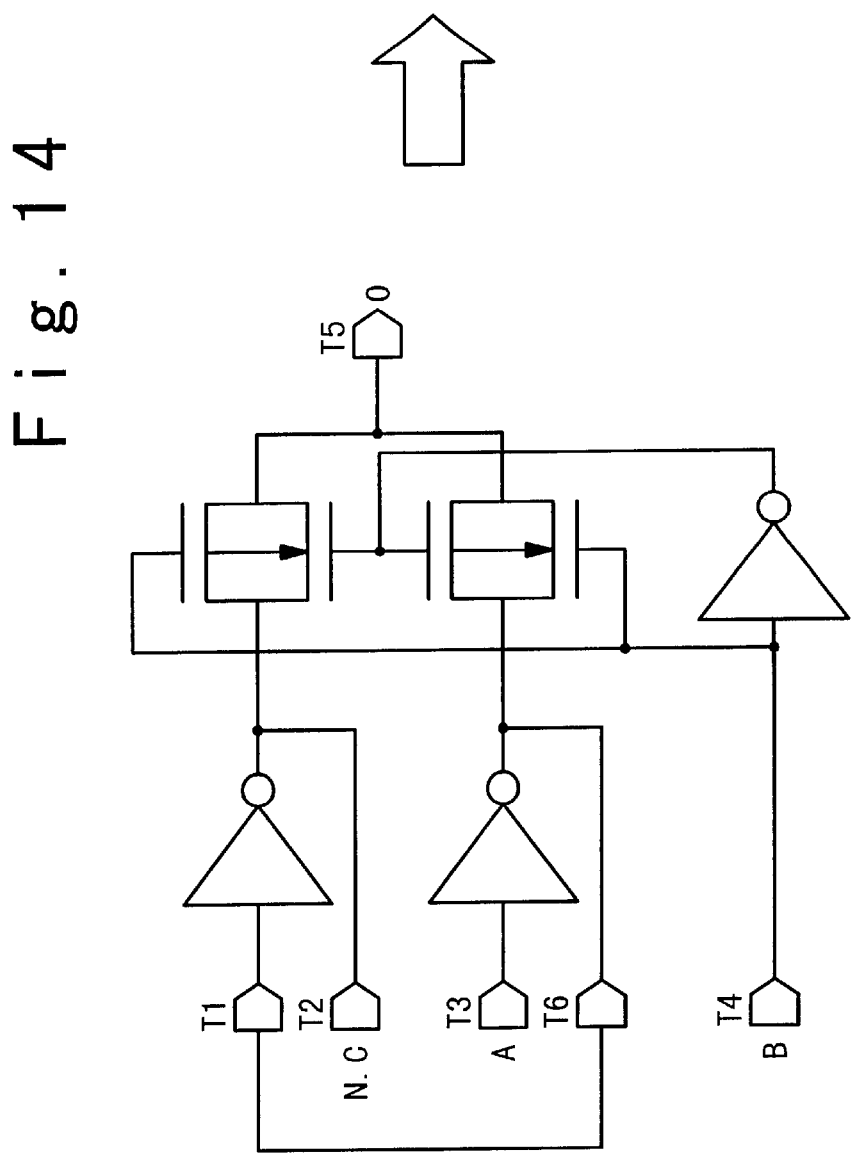
FIG. 14 is a view showing an example in which an EXOR circuit is constituted by using the cell shown in FIG. 10.

FIG. 14 is an example in which the first general-purpose logic module of the type shown in FIG. 5 is used to configure an EXOR circuit.

This EXOR circuit is formed such that the first node T1 and the sixth node T6 of the first general-purpose logic module X is connected to each other, and the second node T2 is set at the non-connection. Thus, the two-input EXOR circuit is attained in which the third node T3 (A) and the fourth node T4 (B) are used as the input terminals, and the fifth node T5 is used as the output terminal (O).

According to this EXOR circuit, although the inputted signal in the general-purpose logic module explained in the column of the description of the related art is passed through the logic elements of the four or six stages until the signal is outputted, the inputted signal is only passed through the logic elements of the three stages such as the inverters of two stages and the transfer gate of one stage. Thus, it is possible to shorten the time of the inner gate delay.

It should be noted that this EXOR circuit can be formed by using the first general-purpose logic module of the type shown in FIG. 7. In this case, the first node T1 and the sixth node T6 are connected to each other. Thus, the two-input EXOR circuit is attained in which the third node T3 (A) and the fourth node T4 (B) are used as the input terminals, and the fifth node T5 is used as the output terminal (O).

Also, this EXOR circuit can be formed by using the first general-purpose logic module of the type shown in FIG. 6. In this case, the second node T2 and the third node T3 are connected to each other. Thus, the two-input EXOR circuit is attained in which the first node T1 (A) and the fourth node T4 (B) are used as the input terminals, and the fifth node T5 is used as the output terminal (O).

Figure 15:
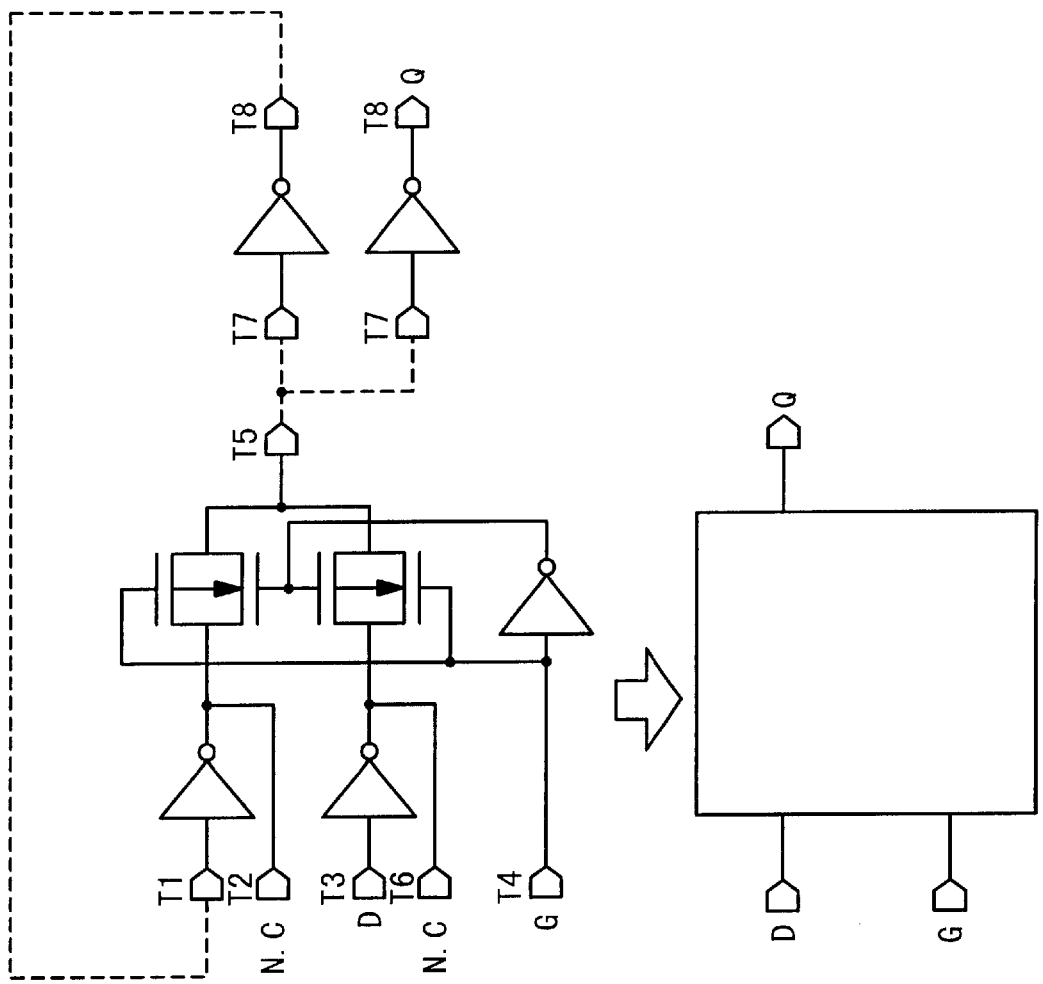
FIG. 15 is a view showing an example in which a data latch circuit is constituted by using the cell shown in FIG. 10.

FIG. 15 is an example in which a data latch circuit is formed by using one first general-purpose logic module X of the type shown in FIG. 5 and two second general-purpose logic modules Y.

In this data latch circuit, the fifth node T5 of the first general-purpose logic module X is connected to an input terminal of an inverter (hereafter, referred to as "first module" in this paragraph) that is one of the second general-purpose logic modules Y, and an output terminal of this first module is connected to the first node T1 of the first general-purpose logic module X. Also, the fifth node T5 of the first general-purpose logic module X is connected to an input terminal of an inverter (hereafter, referred to as "second module" in this paragraph) that is the other one of the second general-purpose logic modules Y. Thus, the data latch circuit is attained in which the third node T3 of the first general-purpose logic module X is used as a data input terminal (D), the fourth node T4 is used as an enable input terminal (G), and an output terminal of the second module is used as an output terminal (Q). This data latch circuit is constituted only by one two-input multiplexer of the inversion output type and two inverters. Thus, the latch circuit can be simply composed.

Figure 16:
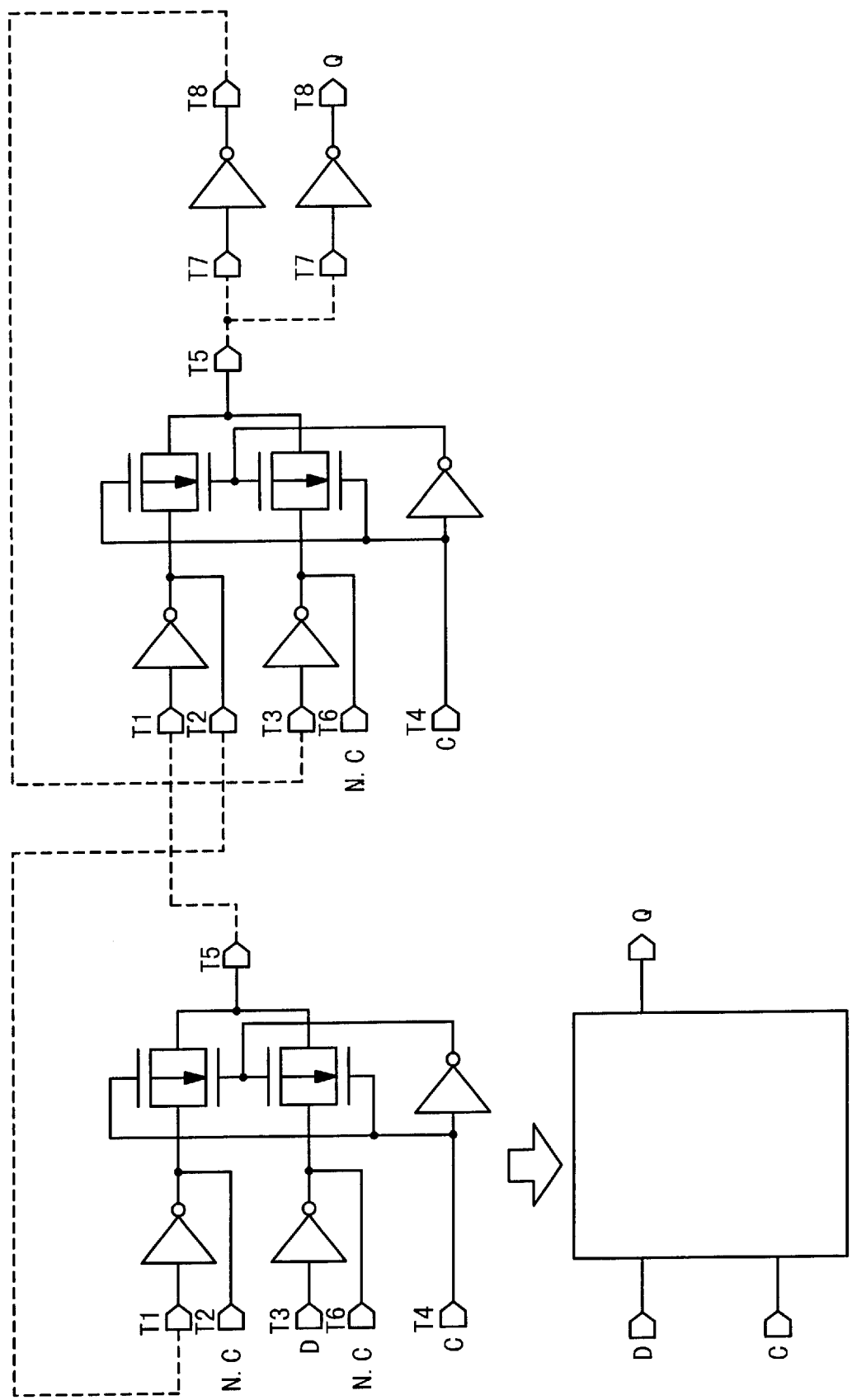
FIG. 16 is a view showing an example in which a flip-flop circuit is constituted by using the cell shown in FIG. 10.

FIG. 16 is an example in which a D-type flip-flop circuit is formed by using two first general-purpose logic modules X of the type shown in FIG. 5 and two second general-purpose logic modules Y.

In this flip-flop circuit, a fifth node T5 of a multiplexer (hereafter, referred to as "first Module" in this paragraph) that is one of the first general-purpose logic modules X is connected to a first node T1 of a multiplexer (hereafter, referred to as "second module" in this paragraph) that is the other one of the first general-purpose logic module X, and a fifth node T5 of this second module is connected to an input terminal of an inverter (hereafter, referred to as "third module") of an inverter that is one of the second general-purpose logic module Y, and an output terminal of this third module is connected to a first node T1 of the first module.

Also, a fifth node T5 of the second module is connected to an input terminal of an inverter (hereafter, referred to as "fourth module" in this paragraph) that is the other one of the second general-purpose logic module Y. Thus, the D-type flip-flop circuit is attained in which a third node T3 of the first module is used as a data input terminal (D), a fourth node T4 of the first module and a fourth node T4 of the second module are used as clock input terminals (C), and an output terminal of the fourth module is used as an output terminal (Q).

This flip-flop circuit is constituted only by two two-input multiplexers of the inversion output type and two inverters. Thus, the flip-flop circuit can be simply composed.

It should be noted that, although not shown, the function corresponding to that of the conventional four-input multiplexer can be formed by connecting one third general-purpose logic module Z to two first general-purpose logic modules X, and two two-input multiplexers of the typical non-inversion output type can be formed by connecting the second general-purpose logic module Y to two first general-purpose logic modules X, respectively.

Moreover, for example, two two-input NAND circuits can be formed by using two first general-purpose logic modules X independently of each other, and apart from them, additional one two-input multiplexer of the non-inversion output type can be formed by connecting output terminals of two second general-purpose logic modules Y to input terminals of the third general-purpose logic modules Z, respectively.

As mentioned above, according to the second embodiment, it is designed so as to divide the configuration corresponding to the conventional four-input multiplexer into the multiplexer units of the two-input inversion output types, and individually pick up the output, and delete the number of the logic stages depending on the function, and also add the inverter and further connect the inner node of the two-input multiplexer of the inversion output type shown in FIG. 6 to another node. Thus, it is possible to define the optimal number of the logic stages. Hence, the aspect that a plurality of logic functions can be attained is not lost, even as compared with the conventional four-input multiplexer. Moreover, it is possible to increase the free degree of the circuit configuration.

Figure 17:
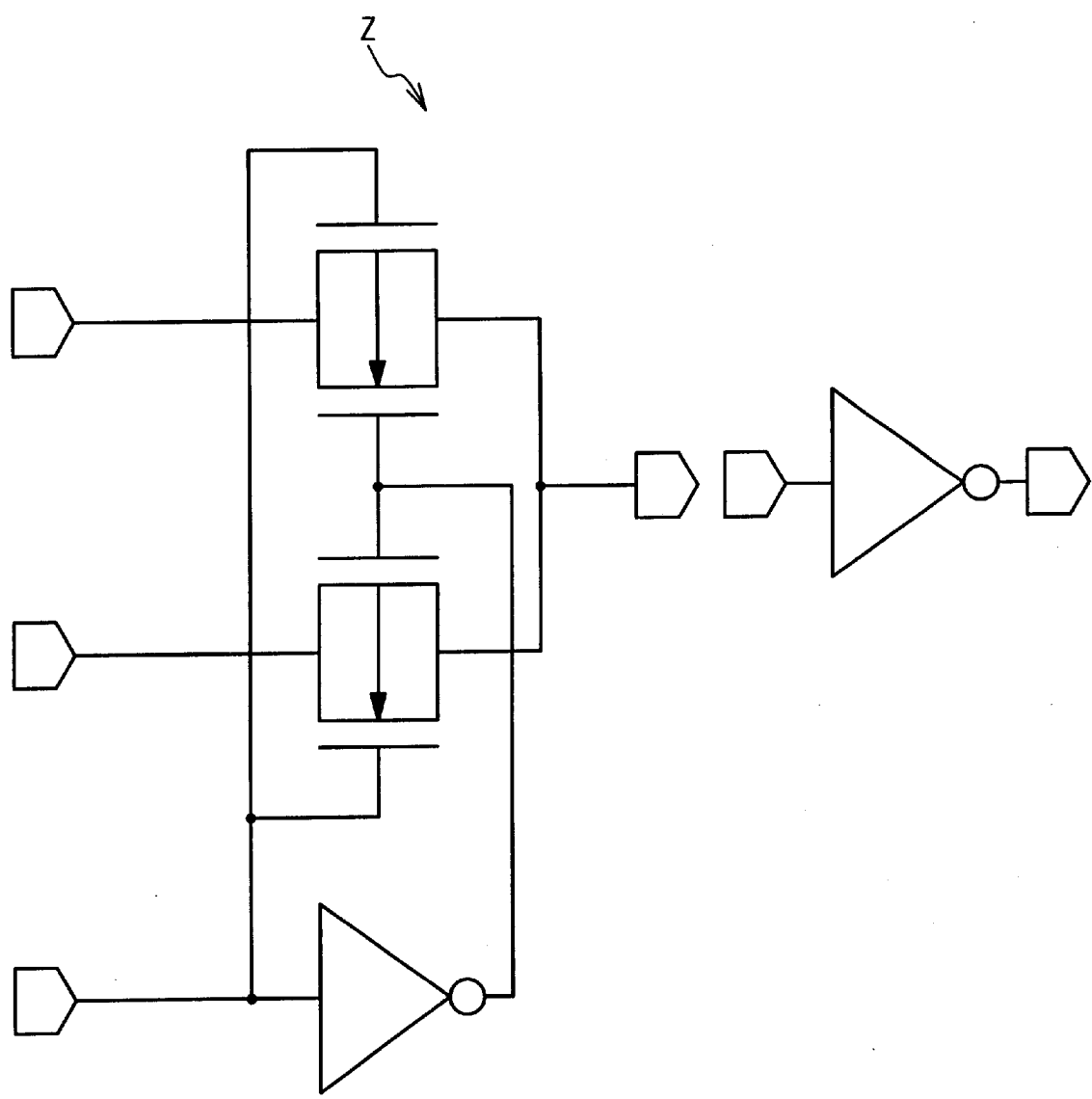
FIG. 17 is a view showing a configuration of a variation of the cell according to the second embodiment of the present invention.

Incidentally, the third general-purpose logic module Z used in the second embodiment can be formed as shown in FIG. 17. That is, it may be formed such that the multiplexer portion and inverter portion of the third general-purpose logic module Z are separated from each other, and respective nodes are placed in the separated portions. This configuration can improve the generalization.

As detailed above, according to the present invention, it is possible to provide the general-purpose logic module in which the switch can be carried out at the high speed, and the cell using the same.

What is claimed is:
1. A general-purpose logic module comprising:
 a first inverter in which an input is connected to a first node;
 a second node which is connected to an output of said first inverter;
 a second inverter in which an input is connected to a third node;
 a third inverter in which an input is connected to a fourth node;
 a first transfer gate in which an input is connected to the output of said first inverter, a first control input is connected to said fourth node, and a second control input is connected to an output of said third inverter;

a second transfer gate in which an input is connected to an output of said second inverter, a first control input is connected to the output of said third inverter, and a second control input is connected to said fourth node; and a fifth node which is connected to an output of said first transfer gate and an output of said second transfer gate, wherein said general purpose logic module comprises a NAND circuit, wherein said third node and said fourth node are used as inputs and said fifth node is used as an output, and wherein said general-purpose logic module is formed by connecting said first node to a logic "0" and setting said second node at a non-connection.

2. A general-purpose logic module comprising:

a first inverter in which an input is connected to a first node;

a second node which is connected to an output of said first inverter;

a second inverter in which and input is connected to a third node;

a third inverter in which an input is connected to a fourth node;

a first transfer gate in which an input is connected to the output of said first inverter, a first control input is connected to said fourth node, and a second control input is connected to an output of said third inverter;

a second transfer gate in which an input is connected to an output of said second inverter, a first control input is connected to the output of said third inverter, and a second control input is connected to said fourth node; and a fifth node which is connected to an output of said first transfer gate and an output of said second transfer gate, wherein a NOR circuit, in which said first node and said fourth node are used as inputs and said fifth node is used as an output, is formed by connecting said third node to a logic "1" and setting said second node at the non-connection.

3. A general-purpose logic module comprising:

a first inverter in which an input is connected to a first node;

a second node which is connected to an output of said first inverter;

a second inverter in which and input is connected to a third node;

a third inverter in which an input is connected to a fourth node;

a first transfer gate in which an input is connected to the output of said first inverter, a first control input is connected to said fourth node, and a second control input is connected to an output of said third inverter;

a second transfer gate in which an input is connected to an output of said second inverter, a first control input is connected to the output of said third inverter, and a second control input is connected to said fourth node;

a fifth node which is connected to an output of said first transfer gate and an output of said second transfer gate, wherein an ENXOR circuit, in which said first node and said fourth node are used as inputs and said fifth node is used as an output, is formed by connecting said second node to said third node.

4. A general-purpose logic module comprising:

a first inverter in which an input is connected to a first node;

a second node which is connected to an output of said first inverter;

a second inverter in which an input is connected to a third node;

a third inverter in which an input is connected to a fourth node;

a first transfer gate in which an input is connected to the output of said first inverter, a first control input is connected to said fourth node, and a second control input is connected to an output of said third inverter;

a second transfer gate in which an input is connected to an output of said second inverter, a first control input is connected to the output of said third inverter, and a second control input is connected to said fourth node;

a fifth node which is connected to an output of said first transfer gate and an output of said second transfer gate; and a sixth node which is connected to the output of said second inverter, wherein said third node and said fourth node are used as inputs and said fifth node is used as an output, and wherein said general-purpose logic module is formed by connecting said first node to said sixth node and setting said second node at the non-connection.

5. A cell comprising:

(A) a first general-purpose logic module comprising:
   a first inverter in which an input is connected to a first node;
   a second node which is connected to an output of said first inverter;
   a second inverter in which an input is connected to a third node;
   a third inverter in which an input is connected to a fourth node;
   a first transfer gate in which an input is connected to the output of said first inverter, a first control input is connected to said fourth node, and a second control input is connected to an output of said third inverter;
   a second transfer gate in which an input is connected to an output of said second inverter, a first control input is connected to the output of said third inverter, and a second control input is connected to said fourth node; and
   a fifth node which is connected to an output of said first transfer gate and an output of said second transfer gate;

(B) a second general-purpose logic module comprising a fourth inverter in which an input is connected to a seventh node and an output is connected to a an eighth node; and (C) a third general-purpose logic module comprising:
   a fifth inverter in which an input is connected to an eleventh node;
   a third transfer gate in which an input is connected to a ninth node, a first control input is connected to said eleventh node, and a second control input is connected to an output of said fifth inverter;
   a fourth transfer gate in which an input is connected to a tenth node, a first control input is connected to an output of said fifth inverter, and a second control input is connected to said eleventh node;
   a sixth inverter in which an input is connected to an output of said third transfer gate and an output of said fourth transfer gate; and
   a twelfth node which is connected to an output of the sixth inverter, wherein said first general-purpose logic module comprises a NAND circuit, and wherein said first node is connected to a logic "0" and said second node is set at a non-connection so that said third node and said fourth node are used as inputs and said fifth node is used as an output.

6. A cell comprising:

(A) a first general-purpose logic module including:
- a first inverter in which an input is connected to a first node;
- a second node which is connected to an output of said first inverter;
- a second inverter in which an input is connected to a third node;
- a third inverter in which an input is connected to a fourth node;
- a first transfer gate in which an input is connected to the output of said first inverter, a first control input is connected to said fourth node, and a second control input is connected to an output of said third inverter;
- a second transfer gate in which an input is connected to an output of said second inverter, a first control input is connected to the output of said third inverter, and a second control input is connected to said fourth node; and
- a fifth node which is connected to an output of said first transfer gate and an output of said second transfer gate;

(B) a second general-purpose logic module including: a fourth inverter in which an input is connected to a seventh node and an output is connected to a an eighth node; and (C) a third general-purpose logic module including:
- a fifth inverter in which an input is connected to an eleventh node;
- a third transfer gate in which an input is connected to a ninth node, a first control input is connected to said eleventh node, and a second control input is connected to an output of said fifth inverter;
- a fourth transfer gate in which an input is connected to a tenth node, a first control input is connected to an output of said fifth inverter, and a second control input is connected to said eleventh node;
- a sixth inverter in which an input is connected to an output of said third transfer gate and an output of said fourth transfer gate; and
- a twelfth node which is connected to an output of the sixth inverter, wherein said first general-purpose logic module is formed in a NOR circuit, in which said third node is connected to a logic "1" and said second node is set at a non-connection so that said first node and said fourth node are used as inputs and said fifth node is used as an output.

7. A cell comprising:

(A) a first general-purpose logic module including:
- a first inverter in which an input is connected to a first node;
- a second node which is connected to an output of said first inverter;
- a second inverter in which an input is connected to a third node;
- a third inverter in which an input is connected to a fourth node;
- a first transfer gate in which an input is connected to the output of said first inverter, a first control input is connected to said fourth node, and a second control input is connected to an output of said third inverter;
- a second transfer gate in which an input is connected to an output of said second inverter, a first control input is connected to the output of said third inverter, and a second control input is connected to said fourth node; and
- a fifth node which is connected to an output of said first transfer gate and an output of said second transfer gate;

(B) a second general-purpose logic module including: a fourth inverter in which an input is connected to a seventh node and an output is connected to a an eighth node; and (C) a third general-purpose logic module including:
- a fifth inverter in which an input is connected to an eleventh node;
- a third transfer gate in which an input is connected to a ninth node, a first control input is connected to said eleventh node, and a second control input is connected to an output of said fifth inverter;
- a fourth transfer gate in which an input is connected to a tenth node, a first control input is connected to an output of said fifth inverter, and a second control input is connected to said eleventh node;
- a sixth inverter in which an input is connected to an output of said third transfer gate and an output of said fourth transfer gate; and
- a twelfth node which is connected to an output of the sixth inverter, wherein said first general-purpose logic module is formed in an EXNOR circuit, in which said second node is connected to said third node so that said first node and said fourth node are used as inputs and said fifth node is used as an output.

8. A cell comprising:

(A) a first general-purpose logic module comprising:
- a first inverter in which an input is connected to a first node;
- a second node which is connected to an output of said first inverter;
- a second inverter in which an input is connected to a third node;
- a third inverter in which an input is connected to a fourth node;
- a first transfer gate in which an input is connected to the output of said first inverter, a first control input is connected to said fourth node, and a second control input is connected to an output of said third inverter;
- a second transfer gate in which an input is connected to an output of said second inverter, a first control input is connected to the output of said third inverter, and a second control input is connected to said fourth node;
- a fifth node which is connected to an output of said first transfer gate and an output of said second transfer gate; and
- a sixth node which is connected to the output of said second inverter, (B) a second general-purpose logic module comprising a fourth inverter in which an input is connected to a seventh node and an output is connected to a an eighth node: and (C) a third general-purpose logic module comprising:
- a fifth inverter in which an input is connected to an eleventh node;
- a third transfer gate in which an input is connected to a ninth node, a first control input is connected to said eleventh node, and a second control input is connected to an output of said fifth inverter;

a fourth transfer gate in which an input is connected to a tenth node, a first control input is connected to an output of said fifth inverter, and a second control input is connected to said eleventh node;

a sixth inverter in which an input is connected to an output of said third transfer gate and an output of said fourth transfer gate; and a twelfth node which is connected to an output of the sixth inverter, wherein said first general-purpose logic module further comprises a sixth node which is connected to the output of said second inverter, and wherein said first general-purpose logic module is formed in an EXOR circuit, in which said first node is connected to said sixth node and said second node is set at the non-connection so that said third node and said fourth node are used as inputs and said fifth node is used as an output.

9. A cell comprising:
(A) a first general-purpose logic module including:
a first inverter in which an input is connected to a first node;
a second node which is connected to an output of said first inverter;
a second inverter in which an input is connected to a third node;
a third inverter in which an input is connected to a fourth node;
a first transfer gate in which an input is connected to the output of said first inverter, a first control input is connected to said fourth node, and a second control input is connected to an output of said third inverter;
a second transfer gate in which an input is connected to an output of said second inverter, a first control input is connected to the output of said third inverter, and a second control input is connected to said fourth node; and
a fifth node which is connected to an output of said first transfer gate and an output of said second transfer gate;

(B) a second general-purpose logic module including: a fourth inverter in which an input is connected to a seventh node and an output is connected to a an eighth node; and (C) a third general-purpose logic module including:
a fifth inverter in which an input is connected to an eleventh node;
a third transfer gate in which an input is connected to a ninth node, a first control input is connected to said eleventh node, and a second control input is connected to an output of said fifth inverter;
a fourth transfer gate in which an input is connected to a tenth node, a first control input is connected to an output of said fifth inverter, and a second control input is connected to said eleventh node;
a sixth inverter in which an input is connected to an output of said third transfer gate and an output of said fourth transfer gate; and
a twelfth node which is connected to an output of the sixth inverter, wherein a latch circuit is formed by setting said second node of said first general-purpose logic module at a non-connection, and connecting said first node to said eighth node of a first module which is one of said second general-purpose logic module, and connecting said fifth node to said seventh node of said first module and said seventh node of a second module which is another one of said second general-purpose logic module, such that said third node of said first general-purpose logic module is used as a data input, and said fourth node is used as an enable input, and said eighth node of said second module is used as an output.

10. A cell comprising:
(A) a first general-purpose logic module including:
a first inverter in which an input is connected to a first node;
a second node which is connected to an output of said first inverter;
a second inverter in which an input is connected to a third node;
a third inverter in which an input is connected to a fourth node;
a first transfer gate in which an input is connected to the output of said first inverter, a first control input is connected to said fourth node, and a second control input is connected to an output of said third inverter;
a second transfer gate in which an input is connected to an output of said second inverter, a first control input is connected to the output of said third inverter, and a second control input is connected to said fourth node; and
a fifth node which is connected to an output of said first transfer gate and an output of said second transfer gate;

(B) a second general-purpose logic module including: a fourth inverter in which an input is connected to a seventh node and an output is connected to a an eighth node; and (C) a third general-purpose logic module including:
a fifth inverter in which an input is connected to an eleventh node;
a third transfer gate in which an input is connected to a ninth node, a first control input is connected to said eleventh node, and a second control input is connected to an output of said fifth inverter;
a fourth transfer gate in which an input is connected to a tenth node, a first control input is connected to an output of said fifth inverter, and a second control input is connected to said eleventh node;
a sixth inverter in which an input is connected to an output of said third transfer gate and an output of said fourth transfer gate; and
a twelfth node which is connected to an output of the sixth inverter, wherein a flip-flop circuit is formed by setting said second node of a first module which is one of said first general-purpose logic module at a non-connection, connecting said first node of said first module to said second node of a second module which is another one of said first general-purpose logic module, connecting said fifth node of said first module to said first node of said second module, connection said third node of said second module to said eighth node of a third module which is one of said second general-purpose logic module, and connecting said fifth node to said seventh node of said third module and said seventh node of a fourth module that is another one of said second general-purpose logic module, such that a third node of said first module is used as a data input, and said fourth node of said first module and said fourth node of said second module are used as clock inputs, and said eighth node of said fourth module is used as an output.

11. A general-purpose logic module comprising:

a first inverter in which an input is connected to a first node;

a second inverter in which an input is connected to a third node;

a sixth node which is connected to an output of the second inverter;

a third inverter in which an input is connected to a fourth node;

a first transfer gate in which an input is connected to an output of said first inverter, a first control input is connected to said fourth node, and a second control input is connected to an output of said third inverter;

a second transfer gate in which an input is connected to an output of said second inverter, a first control input is connected to an output of said third inverter, and a second control input is connected to said fourth node; and a fifth node which is connected to an output of said first transfer gate and an output of said second transfer gate, wherein said general-purpose logic module comprises a NAND circuit, and wherein said third node and said fourth node are used as inputs and said fifth node is used as an output, and wherein said general-purpose logic module is formed by connecting said first node to a logic "0" and setting said sixth node at a non-connection.

12. A general-purpose logic module comprising:

a first inverter in which an input is connected to a first node;

a second inverter in which an input is connected to a third node;

a sixth node which is connected to an output of the second inverter;

a third inverter in which an input is connected to a fourth node;

a first transfer gate in which an input is connected to an output of said first inverter, a first control input is connected to said fourth node, and a second control input is connected to an output of said third inverter;

a second transfer gate in which an input is connected to an output of said second inverter, a first control input is connected to an output of said third inverter, and a second control input is connected to said fourth node; and a fifth node which is connected to an output of said first transfer gate and an output of said second transfer gate, wherein a NOR circuit, in which said first node and said fourth node are used as inputs and said fifth node is used as an output, is formed by connecting said third node to a logic "1" and setting said sixth node at a non-connection.

13. A general-purpose logic module comprising:

a first inverter in which an input is connected to a first node;

a second inverter in which an input is connected to a third node;

a sixth node which is connected to an output of the second inverter;

a third inverter in which an input is connected to a fourth node;

a first transfer gate in which an input is connected to an output of said first inverter, a first control input is connected to said fourth node, and a second control input is connected to an output of said third inverter;

a second transfer gate in which an input is connected to an output of said second inverter, a first control input is connected to an output of said third inverter, and a second control input is connected to said fourth node;

a fifth node which is connected to an output of said first transfer gate and an output of said second transfer gate; and a second node which is connected to the output of said first inverter, wherein an EXNOR circuit, in which said first node and said fourth node are used as inputs and said fifth node is used as an output, is formed by connecting said second node to said third node and setting said sixth node at a non-connection.

14. A general-purpose logic module comprising:

a first inverter in which an input is connected to a first node;

a second inverter in which an input is connected to a third node;

a sixth node which is connected to an output of the second inverter;

a third inverter in which an input is connected to a fourth node;

a first transfer gate in which an input is connected to an output of said first inverter, a first control input is connected to said fourth node, and a second control input is connected to an output of said third inverter;

a second transfer gate in which an input is connected to an output of said second inverter, a first control input is connected to an output of said third inverter, and a second control input is connected to said fourth node; and a fifth node which is connected to an output of said first transfer gate and an output of said second transfer gate, wherein an EXOR circuit, in which said third node and said fourth node are used as inputs and said fifth node is used as an output, is formed by connecting said first node to said sixth node.

15. A cell comprising:

(A) a first general-purpose logic module comprising:
  a first inverter in which an input is connected to a first node;
  a second inverter in which an input is connected to a third node;
  a sixth node which is connected to an output of the second inverter;
  a third inverter in which an input is connected to a fourth node;
  a first transfer gate in which an input is connected to an output of said first inverter, a first control input is connected to said fourth node, and a second control input is connected to an output of said third inverter;
  a second transfer gate in which an input is connected to an output of said second inverter, a first control input is connected to an output of said third inverter, and a second control input is connected to said fourth node; and
  a fifth node which is connected to an output of said first transfer gate and an output of said second transfer gate;

(B) a second general-purpose logic module comprising a fourth inverter in which an input is connected to a seventh node and an output is connected to an eighth node; and (C) a third general-purpose logic module comprising:
  a fifth inverter in which an input is connected to an eleventh node;
  a third transfer gate in which an input is connected to a ninth node, a first control input is inputted to said eleventh node, and a second control input is connected to an output of said fifth inverter;
  a fourth transfer gate in which an input is connected to a tenth node, a first control input is connected to an output of said fifth inverter, and a second control input is connected to said eleventh node;
  a sixth inverter in which an input is connected to an output of said third transfer gate and an output of said fourth transfer gate; and
  a twelfth node which is connected to an output of the sixth inverter,
  wherein said first general-purpose logic module comprises a NAND circuit, and
  wherein said first node is connected to a logic "0" and sixth node is set at a non-connection so that said third node and said fourth node are used as inputs and said fifth node is used as an output.

16. A cell comprising:
(A) a first general-purpose logic module including:
  a first inverter in which an input is connected to a first node;
  a second inverter in which an input is connected to a third node;
  a sixth node which is connected to an output of the second inverter;
  a third inverter in which an input is connected to a fourth node;
  a first transfer gate in which an input is connected to an output of said first inverter, a first control input is connected to said fourth node, and a second control input is connected to an output of said third inverter;
  a second transfer gate in which an input is connected to an output of said second inverter, a first control input is connected to an output of said third inverter, and a second control input is connected to said fourth node; and
  a fifth node which is connected to an output of said first transfer gate and an output of said second transfer gate;
(B) a second general-purpose logic module including: a fourth inverter in which an input is connected to a seventh node and an output is connected to an eighth node; and
(C) a third general-purpose logic module including:
  a fifth inverter in which an input is connected to an eleventh node;
  a third transfer gate in which an input is connected to a ninth node, a first control input is inputted to said eleventh node, and a second control input is connected to an output of said fifth inverter;
  a fourth transfer gate in which an input is connected to a tenth node, a first control input is connected to an output of said fifth inverter, and a second control input is connected to said eleventh node;
  a sixth inverter in which an input is connected to an output of said third transfer gate and an output of said fourth transfer gate; and
  a twelfth node which is connected to an output of the sixth inverter;
  wherein said first general-purpose logic module is formed in a NOR circuit, in which said third node is connected to a logic "1" and said sixth node is set at the non-connection so that said first node and said fourth node are used as inputs and said fifth node is used as an output.

17. A cell comprising:
(A) a first general-purpose logic module including:
  a first inverter in which an input is connected to a first node;
  a second inverter in which an input is connected to a third node;
  a sixth node which is connected to an output of the second inverter;
  a third inverter in which an input is connected to a fourth node;
  a first transfer gate in which an input is connected to an output of said first inverter, a first control input is connected to said fourth node, and a second control input is connected to an output of said third inverter;
  a second transfer gate in which an input is connected to an output of said second inverter, a first control input is connected to an output of said third inverter, and a second control input is connected to said fourth node; and
  a fifth node which is connected to an output of said first transfer gate and an output of said second transfer gate;
(B) a second general-purpose logic module including: a fourth inverter in which an input is connected to a seventh node and an output is connected to an eighth node; and
(C) a third general-purpose logic module including:
  a fifth inverter in which an input is connected to an eleventh node;
  a third transfer gate in which an input is connected to a ninth node, a first control input is inputted to said eleventh node, and a second control input is connected to an output of said fifth inverter;
  a fourth transfer gate in which an input is connected to a tenth node, a first control input is connected to an output of said fifth inverter, and a second control input is connected to said eleventh node;
  a sixth inverter in which an input is connected to an output of said third transfer gate and an output of said fourth transfer gate; and
  a twelfth node which is connected to an output of the sixth inverter;
  wherein said first general-purpose logic module further comprises a second node which is connected to the output of said first inverter, and said first general-purpose logic module is formed in an EXNOR circuit, in which said second node is connected to said third node so that said first node an said fourth node are used as inputs and said fifth node is used as an output.

18. A cell comprising:
(A) a first general-purpose logic module including:
  a first inverter in which an input is connected to a first node;
  a second inverter in which an input is connected to a third node;
  a sixth node which is connected to an output of the second inverter;
  a third inverter in which an input is connected to a fourth node;
  a first transfer gate in which an input is connected to an output of said first inverter, a first control input is connected to said fourth node, and a second control input is connected to an output of said third inverter;

a second transfer gate in which an input is connected to an output of said second inverter, a first control input is connected to an output of said third inverter, and a second control input is connected to said fourth node; and a fifth node which is connected to an output of said first transfer gate and an output of said second transfer gate;

(B) a second general-purpose logic module including:
a fourth inverter in which an input is connected to a seventh node and an output is connected to an eighth node; and (C) a third general-purpose logic module including:
a fifth inverter in which an input is connected to an eleventh node;

a third transfer gate in which an input is connected to a ninth node, a first control input is inputted to said eleventh node, and a second control input is connected to an output of said fifth inverter;

a fourth transfer gate in which an input is connected to a tenth node, a first control input is connected to an output of said fifth inverter, and a second control input is connected to said eleventh node;

a sixth inverter in which an input is connected to an output of said third transfer gate and an output of said fourth transfer gate; and a twelfth node which is connected to an output of the sixth inverter;

wherein said first general-purpose logic module is formed in an EXOR circuit, in which said first node is connected to said sixth node so that said third node and said fourth node are used as inputs and said fifth node is used as an output.

19. A cell comprising:

(A) a first general-purpose logic module including:
a first inverter in which an input is connected to a first node;

a second inverter in which an input is connected to a third node;

a sixth node which is connected to an output of the second inverter;

a third inverter in which an input is connected to a fourth node;

a first transfer gate in which an input is connected to an output of said first inverter, a first control input is connected to said fourth node, and a second control input is connected to an output of said third inverter;

a second transfer gate in which an input is connected to an output of said second inverter, a first control input is connected to an output of said third inverter, and a second control input is connected to said fourth node; and a fifth node which is connected to an output of said first transfer gate and an output of said second transfer gate;

(B) a second general-purpose logic module including:
a fourth inverter in which an input is connected to a seventh node and an output is connected to an eighth node; and (C) a third general-purpose logic module including:
a fifth inverter in which an input is connected to an eleventh node;

a third transfer gate in which an input is connected to a ninth node, a first control input is inputted to said eleventh node, and a second control input is connected to an output of said fifth inverter;

a fourth transfer gate in which an input is connected to a tenth node, a first control input is connected to an output of said fifth inverter, and a second control input is connected to said eleventh node;

a sixth inverter in which an input is connected to an output of said third transfer gate and an output of said fourth transfer gate; and a twelfth node which is connected to an output of the sixth inverter;

wherein a latch is formed by setting said sixth node of said first general-purpose logic module at a non-connection, and connecting said first node to said eighth node of a first module that is one of said second general-purpose logic module, and connecting said fifth node to said seventh node of said first module and said seventh node of a second module which is another one of said second general-purpose logic module, such that said third node of said first general-purpose logic module is used as a data input, and said fourth node is used as an enable input, and said eighth node of said second module is used as an output.

* * * * *